United States Patent
Kang et al.

(10) Patent No.: US 10,782,817 B2
(45) Date of Patent: Sep. 22, 2020

(54) INPUT DEVICE AND ELECTRONIC APPARATUS COMPRISING THE SAME

(71) Applicant: Samsung Electronics Co., Ltd., Gyeonggi-do (KR)

(72) Inventors: Han-Vit Kang, Gyeonggi-do (KR); Ho-Kyung Kang, Daegu (KR); Byeong-Cheol Kim, Gyeonggi-do (KR); Jung Won Kim, Gyeonggi-do (KR); Kyungwan Park, Gyeonggi-do (KR); Jeongsik Jeong, Gyeonggi-do (KR); Kwang-Tai Kim, Gyeonggi-do (KR); Hyungsup Byeon, Gyeonggi-do (KR); Hyun-Ju Hong, Gyeonggi-do (KR)

(73) Assignee: Samsung Electronics Co., Ltd., Yeongtong-du, Suwon-si, Gyeonggi-do (KR)

( * ) Notice: Subject to any disclaimer, the term of this patent is extended or adjusted under 35 U.S.C. 154(b) by 105 days.

(21) Appl. No.: 15/672,570

(22) Filed: Aug. 9, 2017

(65) Prior Publication Data
US 2018/0046305 A1    Feb. 15, 2018

(30) Foreign Application Priority Data

Aug. 9, 2016    (KR) .......................... 10-2016-0101407

(51) Int. Cl.
*G06F 3/041*    (2006.01)
*G06F 1/16*    (2006.01)
(Continued)

(52) U.S. Cl.
CPC .......... *G06F 3/0414* (2013.01); *G06F 1/1626* (2013.01); *G06F 1/1637* (2013.01);
(Continued)

(58) Field of Classification Search
CPC .... G06F 1/1626; G06F 3/0414; G06F 1/1637; H05B 33/145; H04M 1/0266
See application file for complete search history.

(56) References Cited

U.S. PATENT DOCUMENTS

2009/0267906 A1*  10/2009  Schroderus ........... G06F 3/0414
                                                 345/173
2010/0259497 A1*  10/2010  Livingston .............. G06F 3/041
                                                 345/173
(Continued)

FOREIGN PATENT DOCUMENTS

KR         10-1290078 B1     7/2013
KR     10-2015-0102072 A     9/2015

*Primary Examiner* — Abbas I Abdulselam
(74) *Attorney, Agent, or Firm* — Cha & Reiter, LLC.

(57) ABSTRACT

According to one or more embodiments, an electronic device includes a housing including a first surface facing a first direction and a second surface facing a second direction opposite to the first direction, where a transparent cover forms at least one part of the first surface. The electronic device also includes a touch screen display disposed between the first surface and second surface of the housing and exposed through the transparent cover, a pressure sensor disposed between the touch screen display and the second surface of the housing, and having an active area for sensing pressure placed on the first surface by an external object and an inactive area disposed around the active area, a Printed Circuit Board (PCB) disposed between the pressure sensor and the second surface of the housing, and an electrically conductive connection member for electrically connecting the pressure sensor and the PCB. The electrically conductive connection member may be at least partially overlap with the active area of the pressure sensor when the electronic device is viewed in the second direction. Other embodiments are also disclosed.

20 Claims, 26 Drawing Sheets

(51) Int. Cl.
*G06F 3/044* (2006.01)
*H04M 1/02* (2006.01)
*H05B 33/14* (2006.01)
*H05K 1/14* (2006.01)

(52) U.S. Cl.
CPC .......... *G06F 3/044* (2013.01); *H04M 1/0266* (2013.01); *H05B 33/145* (2013.01); *G06F 2203/04104* (2013.01); *G06F 2203/04105* (2013.01); *H05K 1/147* (2013.01); *H05K 2201/10128* (2013.01); *H05K 2201/10151* (2013.01); *H05K 2201/10318* (2013.01)

(56) References Cited

U.S. PATENT DOCUMENTS

| | | | |
|---|---|---|---|
| 2012/0057312 A1* | 3/2012 | Yoo | G06F 3/041 361/749 |
| 2014/0184057 A1 | 7/2014 | Kim et al. | |
| 2014/0292686 A1* | 10/2014 | Yamamoto | G06F 3/0412 345/173 |
| 2015/0334211 A1* | 11/2015 | Shin | G06F 3/041 455/566 |
| 2016/0062500 A1 | 3/2016 | Kessler et al. | |
| 2016/0127523 A1* | 5/2016 | Rouaissia | H04M 1/0266 455/566 |
| 2017/0102825 A1* | 4/2017 | Kim | G06F 3/0418 |

* cited by examiner

INPUT DEVICE AND ELECTRONIC APPARATUS COMPRISING THE SAME

CLAIM OF PRIORITY

This application claims the benefit under 35 U.S.C. § 119(a) of a Korean patent application filed in the Korean Intellectual Property Office on Aug. 9, 2016 and assigned Serial No. 10-2016-0101407, the entire disclosure of which is hereby incorporated by reference.

BACKGROUND

1. Field of the Disclosure

The present disclosure relates to an input device and an electronic device including the input device.

2. Description of the Related Art

Electronic devices such as smartphones may be equipped with screens that can perform a number of functions. For example, the electronic device may output media and also perform a touch sensing function or the like by using a touch screen display in an active area. Meanwhile, the electronic device may also include a bezel (or an inactive area) which surrounds the screen. This inactive area may be implemented as an opaque printed layer or the like so electronic components such as wiring, driving circuits, conductive connection members (e.g. connector extracting portions, flexible printed circuit boards), or the like are obscured from the user.

SUMMARY

Together with the existing touch screen display, the electronic device may also use a pressure sensor (or a "force sensor" interchangeably used hereinafter) for detecting pressure input. Therefore, the electronic device may further include the wiring, driving circuit, conductive connection member, or the like for the pressure sensor in the bezel of the device, causing the bezel to become wider. In particular, upper and lower bezels of the electronic device may be required to be wider in order to mount the conductive connection member for connecting the display and the pressure sensor to a printed circuit board.

Accordingly, various embodiments of the present disclosure provide an input device for decreasing the width of a bezel.

According to one embodiment, an electronic device includes a housing including a first surface facing a first direction and a second surface facing a second direction opposite to the first direction, where a transparent cover forms at least one part of the first surface. The electronic device also includes a touch screen display disposed between the first surface and second surface of the housing and exposed through the transparent cover, a pressure sensor disposed between the touch screen display and the second surface of the housing, and having an active area for sensing pressure placed on the first surface by an external object and an inactive area disposed around the active area, a Printed Circuit Board (PCB) disposed between the pressure sensor and the second surface of the housing, and an electrically conductive connection member for electrically connecting the pressure sensor and the PCB. The electrically conductive connection member may at least partially overlap with the active area of the pressure sensor when the electronic device is viewed in the second direction.

According to another embodiment, an electronic device includes a housing including a first surface facing a first direction and a second surface facing a second direction opposite to the first direction, where a transparent cover forms at least one part of the first surface. The electronic device also includes a display disposed between the first surface and second surface of the housing and exposed through the transparent cover, a PCB disposed between the display and the second surface of the housing, an input device disposed between the first surface of the housing and the display, and including at least one sensor, and a support member disposed between the display and the PCB. The input device may be electrically connected to the PCB through a first plurality of wirings disposed on the support member, and the display may be electrically connected to the PCB through a second plurality of wirings disposed on the support member.

DETAILED DESCRIPTION

Figure 1:
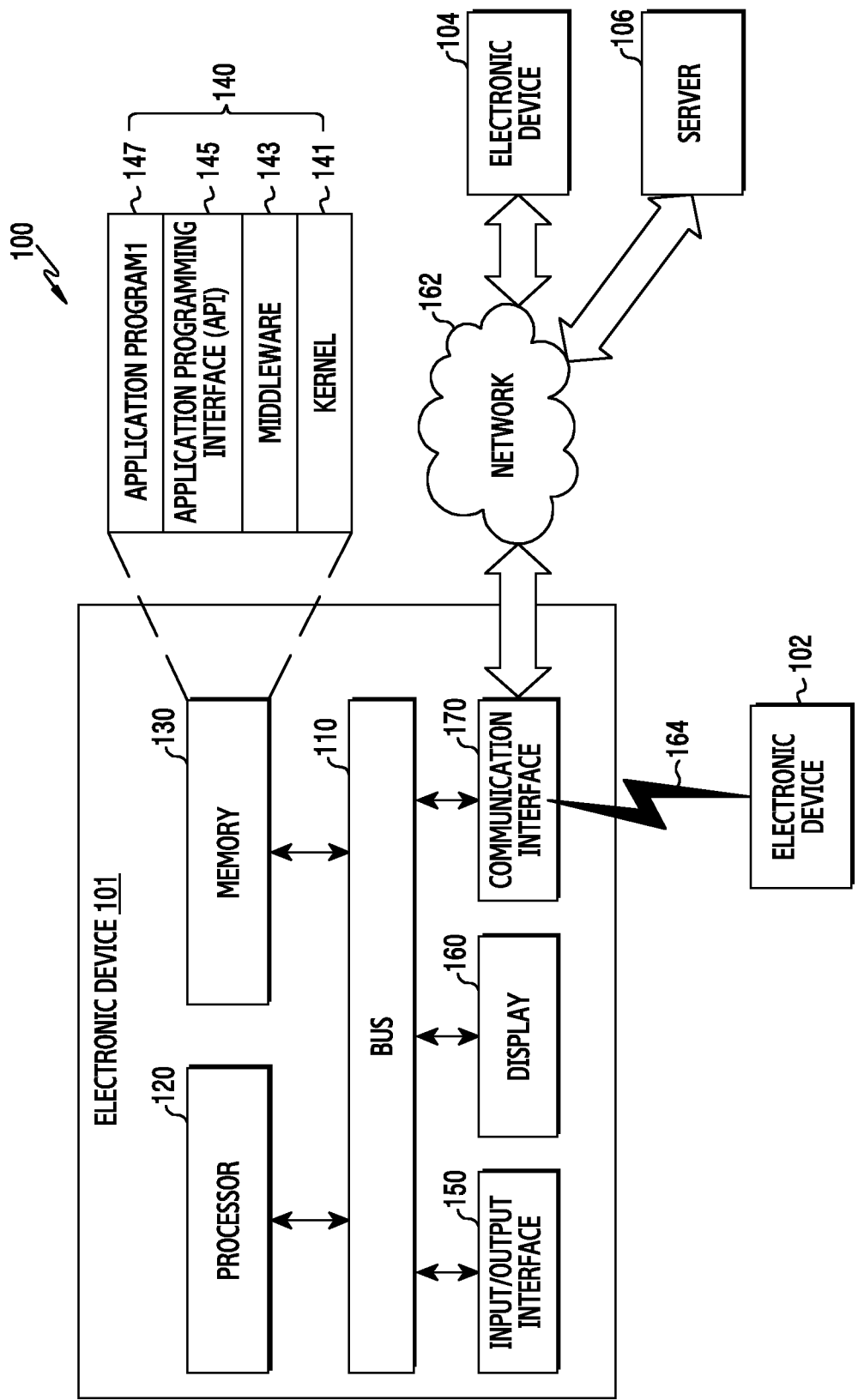
FIG. 1 illustrates a network environment system according to according to one embodiment of the present disclosure.

Hereinafter, various embodiments of the present document are described with reference to the accompanying drawings. It should be understood, however, that it is not intended to limit the embodiments of the present document to the particular form disclosed, but, on the contrary, it is intended to cover all modifications, equivalents, and alternatives falling within the spirit and scope of the embodiments of the present document. Like reference numerals denote like constitutional elements throughout the drawings.

An expression "have," "may have," "include," or "may include" or the like used in the present document is intended to indicate a presence of a corresponding characteristic (e.g., a number, a function, an operation, or a constitutional element such as a component), and should be understood that there are additional possibilities of one or more other characteristics.

In the present document, an expression "A or B," "A and/or B," or "one or more of A and/or B" or the like may include all possible combinations of items enumerated together. For example, "A or B," "at least one of A and B," or "at least one of A or B" may indicate all cases where: (1) at least one A is included; (2) at least one B is included; and (3) at least one A and at least one B are both included.

Although expressions such as "1st," "2nd," "first," and "second" may be used in the present document to express various constitutional elements, it is not intended to limit the corresponding constitutional elements. For example, the above expressions may be used to distinguish one constitutional element from another constitutional element. For example, a 1st user device and a 2nd user device are both user devices, and indicate different user devices. For example, a 1st constitutional element may be termed a 2nd constitutional element, and similarly, the 2nd constitutional element may be termed the 1st constitutional element without departing from the scope of the present document.

When a certain constitutional element (e.g., the 1st constitutional element) is mentioned as being "operatively or communicatively coupled with/to" or "connected to" a different constitutional element (e.g., the 2nd constitutional element), it is to be understood that the certain constitutional element is directly coupled with/to another constitutional element or can be coupled with/to the different constitutional element via another constitutional element (e.g., a 3rd constitutional element). On the other hand, when the certain constitutional element (e.g., the 1st constitutional element) is mentioned as being "directly coupled with/to" or "directly connected to" the different constitutional element (e.g., the 2nd constitutional element), it may be understood that another constitutional element (e.g., the 3rd constitutional element) is not present between the certain constitutional element and the different constitutional element.

An expression "configured to" used in the present document may be interchangeably used with, for example, "suitable for," "having the capacity to," "designed to," "adapted to," "made to," or "capable of" according to a situation. A term "configured to" may not imply only "specially designed to" in a hardware manner. Instead, in a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., Central Processing Unit (CPU) or an Application Processor (AP)) capable of performing corresponding operations by executing one or more software programs stored in a memory device.

Terms used in the present document are for the purpose of describing particular embodiments only and are not intended to limit other embodiments. A singular expression may include a plural expression unless there is a contextually distinctive difference. Unless otherwise defined, all terms (including technical and scientific terms) used herein have the same meaning as commonly understood by those ordinarily skilled in the art disclosed in the present document. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the present document should not be interpreted to exclude the embodiments of the present document.

An electronic device according to various embodiments of the present document may include, for example, at least one of a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device. According to various embodiments, the wearable device may include at least one of an accessory-type device (e.g., a watch, a ring, a bracelet, an anklet, a necklace, glasses, contact lenses, or a Head-Mounted Device (HMD)), a fabric- or clothes-integrated device (e.g., electronic clothes), a body attaching-type device (e.g., a skin pad or tattoo), or a body implantable device (e.g., an implantable circuit).

According to certain embodiments, the electronic device may be a home appliance. The home appliance may include, for example, at least one of a Television (TV), a Digital Video Disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™, PlayStation™), an electronic dictionary, an electronic key, a camcorder, and an electronic picture frame.

According to other embodiments, the electronic device may include at least one of various medical devices (e.g., various portable medical measuring devices (e.g., a blood sugar measuring device, a hear rate measuring device, a blood pressure measuring device, a body temperature measuring device, etc.), Magnetic Resonance Angiography (MRA), Magnetic Resonance Imaging (MRI), Computed Tomography (CT), imaging equipment, ultrasonic instrument, etc.)), a navigation device, a Global Navigation Satellite System (GNSS), an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, an Automatic Teller's Machine (ATM) of financial institutions, Point Of Sales (POS) of shops, and Internet of things (e.g., a light bulb, various sensors, an electric or gas meter, a sprinkler device, a fire alarm, a thermostat, a streetlamp, a toaster, a fitness equipment, a hot water tank, a heater, a boiler, etc.).

According to certain embodiments, the electronic device may include at least one of furniture or a part of buildings/constructions, an electronic board, an electronic signature input device, a projector, and various measurement machines (e.g., water supply, electricity, gas, propagation measurement machine, etc.). In various embodiments, the electronic device may be one or more combinations of the aforementioned various devices. According to certain embodiments, the electronic device may be a flexible device. Further, the electronic device according to an embodiment of the present document is not limited to the aforementioned devices, and may include a new electronic device depending on technical progress.

The term "user" used in the present document may refer to a person who uses the electronic device or a device which uses the electronic device (e.g., an Artificial Intelligence (AI) electronic device).

Hereinafter, various embodiments will be described in detail with reference to the accompanying drawings. However, for convenience of explanation, constitutional elements may be exaggerated or reduced in size in the drawings. For example, a size and thickness of each constitutional element shown in the drawings are arbitrarily shown for convenience of explanation, and thus the present disclosure is not necessarily limited thereto.

Referring to FIG. 1, an electronic device 101 in a network environment 100 is disclosed according to one embodiment. The electronic device 101 may include a bus 110, a processor 120, a memory 130, an input/output interface 150, a display 160, and a communication interface 170. In a certain embodiment, the electronic device 101 may omit at least one of the aforementioned constitutional elements or may additionally include other constitutional elements.

The bus 110 may include a circuit for connecting the aforementioned constitutional elements 110 to 170 to each other and for delivering communication (e.g., a control message and/or data) between the aforementioned constitutional elements.

The processor 120 may include one or more of a Central Processing Unit (CPU), an Application Processor (AP), and a Communication Processor (CP). The processor 120 may control, for example, at least one of other constitutional elements of the electronic device 101 and/or may execute an arithmetic operation or data processing for communication.

The memory 130 may include a volatile and/or non-volatile memory. The memory 130 may store, for example, an instruction or data related to at least one different constitutional element of the electronic device 101. According to one embodiment, the memory 130 may store a software and/or a program 140. The program 140 may include, for example, a kernel 141, a middleware 143, an Application Programming Interface (API) 145, and/or an application program (or an "application") 147, or the like. At least one part of the kernel 141, middleware 143, or API 145 may be referred to as an Operating System (OS).

The kernel 141 may control or manage, for example, system resources (e.g., the bus 110, the processor 120, the memory 130, etc.) used to execute an operation or function implemented in other programs (e.g., the middleware 143, the API 145, or the application program 147). Further, the kernel 141 may provide an interface capable of controlling or managing the system resources by accessing individual constitutional elements of the electronic device 101 in the middleware 143, the API 145, or the application program 147.

The middleware 143 may perform, for example, a mediation role so that the API 145 or the application program 147 can communicate with the kernel 141 to exchange data.

Further, the middleware 143 may handle one or more task requests received from the application program 147 according to a priority. For example, the middleware 143 may assign a priority of using the system resources (e.g., the bus 110, the processor 120, or the memory 130) of the electronic device 101 to at least one of the application programs 147. For instance, the middleware 143 may process the one or more task requests according to the priority assigned to the at least one of the application programs, and thus may perform scheduling or load balancing on the one or more task requests.

The API 145 may include at least one interface or function (e.g., instruction), for example, for file control, window control, video processing, or character control, as an interface capable of controlling a function provided by the application 147 in the kernel 141 or the middleware 143.

For example, the input/output interface 150 may play a role of an interface for delivering an instruction or data input from a user or a different external device(s) to the different constitutional elements of the electronic device 101. Further, the input/output interface 150 may output an instruction or data received from the different constitutional element(s) of the electronic device 101 to the different external device.

The display 160 may include various types of displays, for example, a Liquid Crystal Display (LCD) display, a Light Emitting Diode (LED) display, an Organic Light-Emitting Diode (OLED) display, a MicroElectroMechanical Systems (MEMS) display, or an electronic paper display. The display 160 may display, for example, a variety of contents (e.g., text, image, video, icon, symbol, etc.) to the user. The display 160 may include a touch screen. For example, the display 160 may receive a touch, gesture, proximity, or hovering input by using a stylus pen or a part of a user's body.

The communication interface 170 may establish, for example, communication between the electronic device 101 and the external device (e.g., a 1st external electronic device 102, a 2nd external electronic device 104, or a server 106). For example, the communication interface 170 may communicate with the external device (e.g., the 2nd external electronic device 104 or the server 106) by being connected to a network 162 through wireless communication or wired communication.

For example, as a cellular communication protocol, the wireless communication may use at least one of Long-Term Evolution (LTE), LTE Advance (LTE-A), Code Division Multiple Access (CDMA), Wideband CDMA (WCDMA), Universal Mobile Telecommunications System (UMTS), Wireless Broadband (WiBro), Global System for Mobile Communications (GSM), and the like. Further, the wireless communication may include, for example, a near-distance communication 164. The near-distance communication 164 may include, for example, at least one of Wireless Fidelity (WiFi), Bluetooth, Near Field Communication (NFC), Magnetic Stripe Transmission (MST), Zigbee, and the like. Further, wireless communication may include a Global Navigation Satellite System (GNSS). According to a usage region or a bandwidth or the like, the GNSS may include, for example, at least one of Global Positioning System (GPS), Global Navigation Satellite System (Glonass), Beidou Navigation Satellite System (hereinafter, "Beidou"), Galileo, the European global satellite-based navigation system, and the like. Hereinafter, the "GPS" and the "GNSS" may be used interchangeably in the present document. The wired communication may include, for example, at least one of Universal Serial Bus (USB), High Definition Multimedia Interface (HDMI), Recommended Standard-232 (RS-232), power-line communication, Plain Old Telephone Service (POTS), and the like. The network 162 may include, for example, at least one of a telecommunications network, a computer network (e.g., LAN or WAN), the Internet, and a telephone network.

Each of the 1st and 2nd external electronic devices 102 and 104 may be the same type or different type of the electronic device 101. According to one embodiment, the server 106 may include a group of one or more servers. According to one embodiment, all or some of operations executed by the electronic device 101 may be executed in a different one or a plurality of electronic devices (e.g., the electronic device 102 or 104 or the server 106). According to one embodiment, if the electronic device 101 needs to perform a certain function or service either automatically or at a request, the electronic device 101 may request at least a part of functions related thereto alternatively or additionally to a different electronic device (e.g., the electronic device 102 or 104 or the server 106) instead of executing the function or the service autonomously. The different electronic device (e.g., the electronic device 102 or 104 or the server 106) may execute the requested function or additional function, and may deliver a result thereof to the electronic device 101. The electronic device 101 may provide the requested function or service either directly or by additionally processing the received result. For this, for example, a cloud computing, distributed computing, or client-server computing technique may be used.

Figure 2:
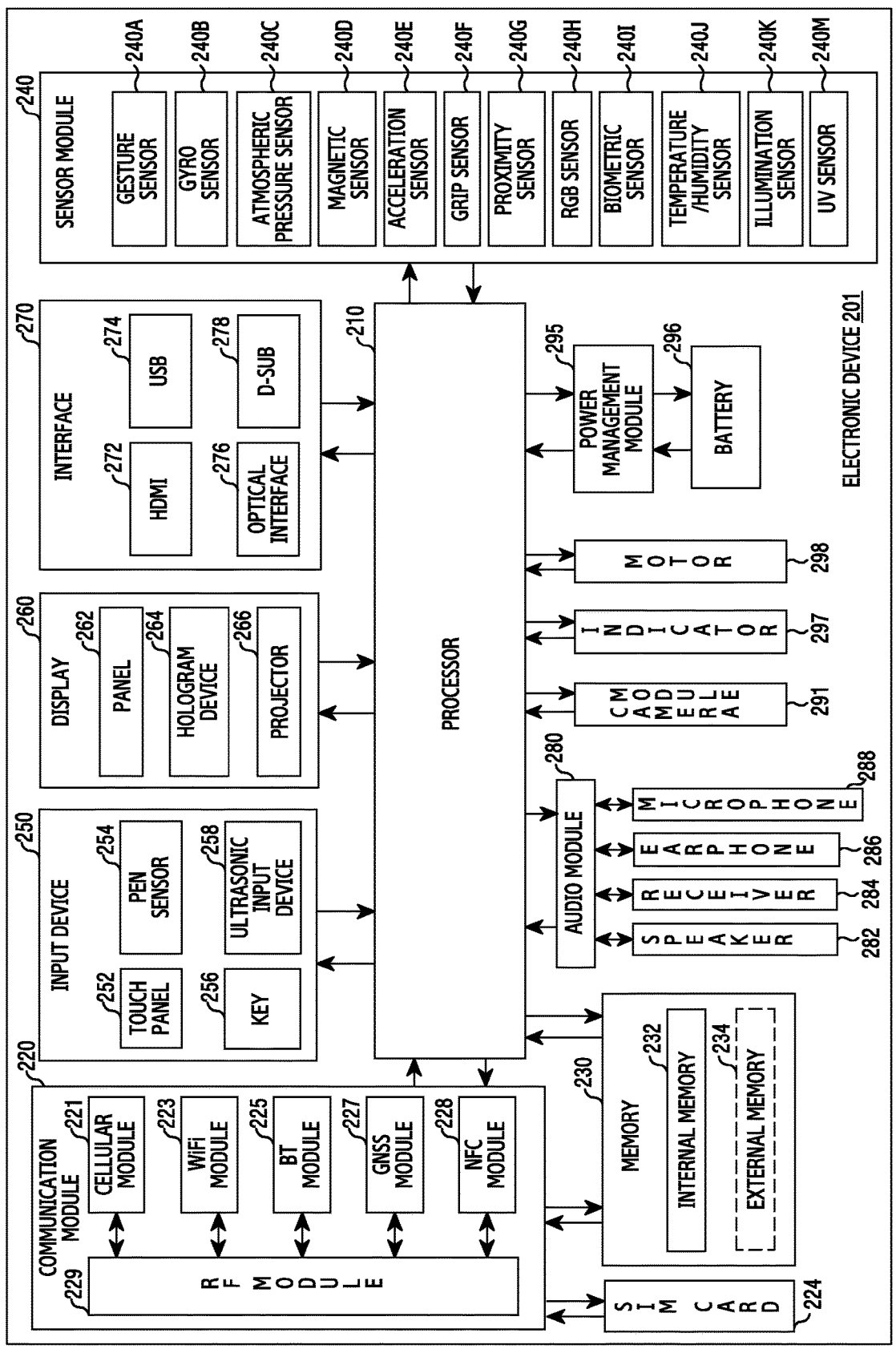
FIG. 2 is a block diagram of an electronic device according to one embodiment of the present disclosure.

FIG. 2 is a block diagram of an electronic device 201 according to one embodiment.

The electronic device 201 may include, for example, all or some parts of the electronic device 101 of FIG. 1. The electronic device 201 may include one or more processors (e.g., Application Processors (APs)) 210, a communication module 220, a subscriber identity module 224, a memory 230, a sensor module 240, an input unit 250, a display 260, an interface 270, an audio module 280, a camera unit 291, a power management module 295, a battery 296, an indicator 297, and a motor 298. The processor 210 may control a plurality of hardware or software constitutional elements connected to the processor 210 by driving, for example, an operating system or an application program, and may process a variety of data including multimedia data and may perform an arithmetic operation. The processor 210 may be implemented, for example, with a System on Chip (SoC). According to various embodiments, the processor 210 may further include a Graphic Processing Unit (GPU) and/or an image signal processor. The processor 210 may include at least one part (e.g., a cellular module 221) of the aforementioned constitutional elements of FIG. 2. The processor 210 may process an instruction or data, which is received from at least one of different constitutional elements (e.g., a non-volatile memory), by loading it to a volatile memory and may store a variety of data in the non-volatile memory.

The communication module 220 (e.g., the communication interface 170) may include, for example, the cellular module 221, a WiFi module 223, a BlueTooth (BT) module 225, a GNSS module 227, a Near Field Communication (NFC) module 228, and a Radio Frequency (RF) module 229. The cellular module 221 may provide a voice call, a video call, a text service, an Internet service, or the like, for example, through a communication network. According to various embodiments, the cellular module 221 may identify and authenticate the electronic device 201 in the communication network by using the subscriber identity module (e.g., a Subscriber Identity Module (SIM) card) 224. According to various embodiments, the cellular module 221 may perform at least some functions that can be provided by the processor 210. According to various embodiments, the cellular module 221 may include a Communication Processor (CP). According to a certain embodiment, at least some (e.g., two or more) of the cellular module 221, the WiFi module 223, the BT module 225, the GNSS module 227, and the NFC module 228 may be included in one Integrated Chip (IC) or IC package. The RF module 229 may transmit/receive, for example, a communication signal (e.g., a Radio Frequency (RF) signal). The RF module 229 may include, for example, a transceiver, a Power Amp Module (PAM), a frequency filter, a Low Noise Amplifier (LNA), an antenna, or the like. According to another embodiment, at least one of the cellular module 221, the WiFi module 223, the BT module 225, the GNSS module 227, and the NFC module 228 may transmit/receive an RF signal via a separate RF module. The subscriber identity module 224 may include, for example, a card including the subscriber identity module and/or an embedded SIM, and may include unique identification information (e.g., an Integrated Circuit Card IDentifier (ICCID)) or subscriber information (e.g., an International Mobile Subscriber Identity (IMSI)).

The memory 230 (e.g., the memory 130) may include, for example, an internal memory 232 or an external memory 234. The internal memory 232 may include, for example, at least one of a volatile memory (e.g., a Dynamic RAM (DRAM), a Static RAM (SRAM), a Synchronous Dynamic RAM (SDRAM), etc.) and a non-volatile memory (e.g., a One Time Programmable ROM (OTPROM), a Programmable ROM (PROM), an Erasable and Programmable ROM (EPROM), an Electrically Erasable and Programmable ROM (EEPROM), a mask ROM, a flash ROM, a flash memory (e.g., a NAND flash memory, a NOR flash memory, etc.), a hard drive, or a Solid State Drive (SSD)). The external memory 234 may further include a flash drive, for example, Compact Flash (CF), Secure Digital (SD), Micro Secure Digital (Micro-SD), Mini Secure digital (Mini-SD), extreme Digital (xD), memory stick, or the like. The external memory 234 may be operatively or physically connected to the electronic device 201 via various interfaces.

The sensor module 240 may measure, for example, physical quantity or detect an operational status of the electronic device 201, and may convert the measured or detected information into an electric signal. The sensor module 240 may include, for example, at least one of a gesture sensor 240A, a gyro sensor 240B, a pressure sensor 240C, a magnetic sensor 240D, an acceleration sensor 240E, a grip sensor 240F, a proximity sensor 240G, a color sensor 240H (e.g., a Red, Green, Blue (RGB) sensor), a bio sensor 240I, a temperature/humidity sensor 240J, an illumination sensor 240K, and an Ultra Violet (UV) sensor 240M. Additionally or alternatively, the sensor module 240 may include, for example, an E-nose sensor, an ElectroMyoGraphy (EMG) sensor, an ElectroEncephaloGram (EEG) sensor, an ElectroCardioGram (ECG) sensor, an Infrared (IR) sensor, an iris sensor, and/or a fingerprint sensor. The sensor module 240 may further include a control circuit for controlling at least one or more sensors included therein. In a certain embodiment, the electronic device 201 may further include a processor configured to control the sensor module 204 either separately or as one part of the processor 210, and may control the sensor module 240 while the processor 210 is in a sleep state.

The input unit 250 may include, for example, a touch panel 252, a (digital) pen sensor 254, a key 256, or an ultrasonic input device 258. The touch panel 252 may recognize a touch input, for example, by using at least one of an electrostatic type, a pressure-sensitive type, and an ultrasonic type. In addition, the touch panel 252 may further include a control circuit. The touch panel 252 may further include a tactile layer and thus may provide the user with a tactile reaction.

The (digital) pen sensor 254 may be, for example, one part of a touch panel, or may include an additional sheet for recognition. The key 256 may be, for example, a physical button, an optical key, a keypad, or a touch key. The ultrasonic input device 258 may detect an ultrasonic wave generated from an input means through a microphone (e.g., a microphone 288) to confirm data corresponding to the detected ultrasonic wave.

In various embodiments, a display (e.g., the display 160) may include a first display 260 or a second display (not shown). The first display 260 may include a first panel 262 and a first Display Driver IC (DDI) 264 configured to control the first panel. The first panel 262 may have a plurality of pixels, and each pixel may include sub-pixels (subordinate pixels) for displaying RGB, i.e., the three primary colors of light. Each of the sub-pixels may include at least one transistor, and may adjust the pixel and represent color according to a magnitude of voltage held (or current flown) at the transistor. The first DDI 264 may include a gate driver circuit unit having On/Off (On&Off) functions to control a gate of the sub-pixels (RGB) and a source driver circuit unit for adjusting a video signal of the sub-pixels (RGB) to create a color difference, and may provide a full screen by adjusting transistors of the sub-pixels of the first panel 262. The first DDI may receive first image data from the processor 210 so that a video or an image is displayed on the first panel 262.

The second display may include a second panel and a second Display Driver IC (DDI) configured to control the second panel. The panel may have a plurality of pixels, and each pixel may include sub-pixels (subordinate pixels) for displaying RGB, i.e., the three primary colors of light. Each of the sub-pixels may include at least one transistor, and may adjust the pixel and represent color according to a magnitude of voltage held (or current flown) at the transistor. The second DDI consists of a gate driver circuit unit having On/Off (On&Off) functions to control a gate of the sub-pixels (RGB) and a source driver circuit unit for adjusting a video signal of the sub-pixels (RGB) to create a color difference, thereby constituting a full screen by adjusting transistors of the sub-pixels of the second panel. The second DDI may receive second image data which is the same as or different from the first image data from the processor 210 so that a video or an image is displayed on the second panel.

At least one of the first and second panels may be implemented, for example, in a flat, flexible, or bendable manner in various embodiments. At least one of the first and second panels may include one or more modules including a touch panel 252 and/or a pen sensor 254.

The first and second displays may include other video output mechanisms (a hologram device, a projector, or the like, not shown above) and/or a control circuit for controlling them.

In embodiments for implementing a device including a plurality of displays, at least one part of changing content (e.g., image data, image data streams, or the like.) may be processed by using the processor 210. The processor may determine to output the changing content to at least one of the first display 260 and/or the second display. For example, the first display 260 may output a command received from the communication module 220 and the second display may output a command received from the sensor module 240. In another embodiment, the content output from the first display 260 may be displayed by being switched or extended on a screen of the second display, or the content output from the second display may be displayed by being switched or extended on a screen of the first display 260.

The interface 270 may include, for example, a High-Definition Multimedia Interface (HDMI) 272, a Universal Serial Bus (USB) 274, an optical communication interface 276, or a D-subminiature (D-sub) 278. The interface 270 may be included, for example, in the communication interface 170 of FIG. 1. Additionally or alternatively, the interface 270 may include, for example, a Mobile High-definition Link (MHL) interface, a Secure Digital (SD)/Multi-Media Card (MMC) interface, or an Infrared Data Association (IrDA) standard interface.

The audio module 280 may bilaterally convert, for example, a sound and electric signal. At least some constitutional elements of the audio module 280 may be included in, for example, the input/output interface 150 of FIG. 1. The audio module 280 may convert sound information which is input or output, for example, through a speaker 282, a receiver 284, an earphone 286, the microphone 288, or the like. The camera unit 291 is, for example, a device for image and video capturing, and according to various embodiments, may include one or more image sensors (e.g., a front sensor or a rear sensor), a lens, an Image Signal Processor (ISP), or a flash (e.g., LED or xenon lamp). The power management module 295 may manage, for example, power of the electronic device 201. According to various embodiments, the power management module 295 may include a Power Management Integrated Circuit (PMIC), a charger Integrated Circuit (IC), or a battery fuel gauge. The PMIC may have a wired and/or wireless charging type. The wireless charging type may include, for example, a magnetic resonance type, a magnetic induction type, an electromagnetic type, or the like, and may further include an additional circuit for wireless charging, for example, a coil loop, a resonant circuit, a rectifier, or the like. The battery gauge may measure, for example, residual quantity of the battery 296 and voltage, current, and temperature during charging. The battery 296 may include, for example, a rechargeable battery and/or a solar battery.

The indicator 297 may display a specific state, for example, a booting state, a message state, a charging state, or the like, of the electronic device 201 or one part thereof (e.g., the processor 210). The motor 298 may convert an electric signal into a mechanical vibration, and may generate a vibration or haptic effect. The electronic device 201 may include, for example, a processing unit (e.g., a GPU) for supporting a mobile TV. The processing unit for supporting the mobile TV may process media data according to a protocol of, for example, Digital Multimedia Broadcasting (DMB), Digital Video Broadcasting (DVB), MediaFlo™, or the like. Each of constitutional elements described in the present document may consist of one or more components, and names thereof may vary depending on a type of an electronic device. In various embodiments, the electronic device (e.g., the electronic device 201) may some of the constitutional elements, or may further include additional other constitutional elements, or some of the constitutional elements may be combined and constructed as one entity, so as to equally perform functions of corresponding constitutional elements before combination.

Each of constitutional elements described in the present document may consist of one or more components, and names thereof may vary depending on a type of an electronic device. The electronic device according to various embodiments may include at least one of the constitutional elements described in the present document. Some of the constitutional elements may be omitted, or additional other constitutional elements may be further included. Further, some of the constitutional elements of the electronic device according to various embodiments may be combined and constructed as one entity, so as to equally perform functions of corresponding constitutional elements before combination.

Figure 3:
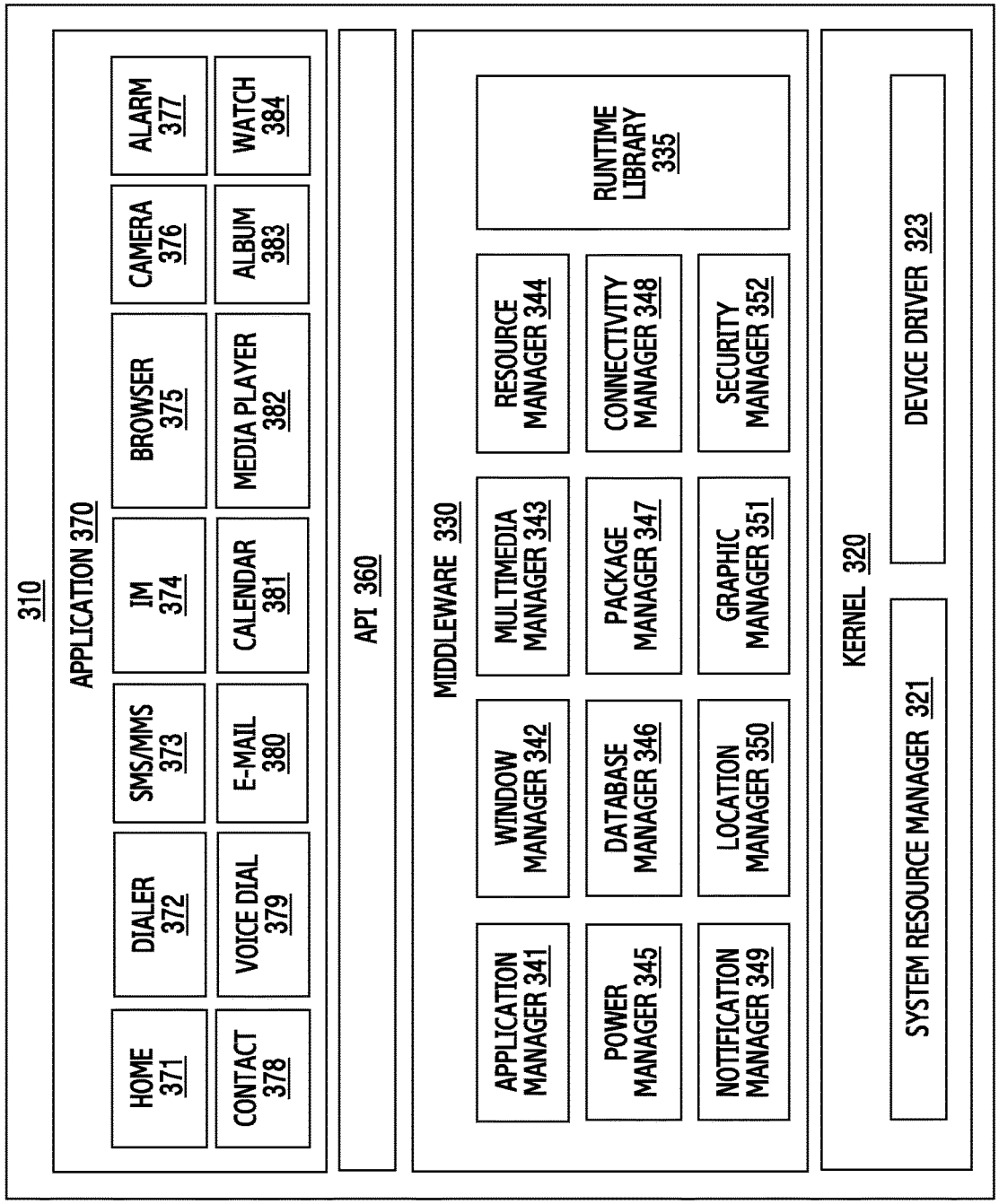
FIG. 3 is a block diagram of a program module according to one embodiment of the present disclosure.

FIG. 3 is a block diagram of a program module according to one embodiment. According to one embodiment, a program module 310 (e.g., the program 140) may include an Operating System (OS) for controlling a resource related to an electronic device (e.g., the electronic device 101) or various applications (e.g., the application 147) driven on the OS. The OS may be, for example, Android, iOS, Windows, Symbian, Tizen, Bada, or the like.

The programming module 310 may include a kernel 320, a middleware 330, an Application Programming Interface (API) 360, and/or an application 370. At least some parts of the program module 310 can be preloaded on the electronic device, or can be downloaded from an external electronic device (e.g., the electronic device 102 or 104, the server 106, or the like).

The kernel 320 (e.g., the kernel 141) may include, for example, a system resource manager 321 or a device driver 323. The system resource manager 321 may perform control, allocation, retrieval, or the like of the system resource. According to various embodiments, the system resource manager 321 may include a process managing unit, a memory managing unit, a file system managing unit, or the like. The device driver 323 may include, for example, a display driver, a camera driver, a Bluetooth driver, a shared memory driver, a USB driver, a keypad driver, a WiFi driver, an audio driver, or an Inter-Process Communication (IPC) driver.

According to one of various embodiments, the display driver may control at least one Display Driver IC (DDI). Functions for controlling a screen may be included at the request of the application 370.

The middleware 330 may provide, for example, a function commonly required by the application 370, or may provide various functions through the API 360 so that the application 370 can effectively use a limited system resource in the electronic device. According to various embodiments, the middleware 330 (e.g., the middleware 143) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include, for example, a library module used by a compiler to add a new function through a programming language while the application 370 is executed. The runtime library 335 may perform an operation of an input/output management, a memory management, an arithmetic function, or the like.

The application manager 341 may manage, for example, a life cycle of at least one application among the applications 370. The window manager 342 may manage a Graphic User Interface (GUI) resource used in a screen. For example, when at least two displays 260 are connected, the screen may be configured or managed differently according to a ratio of the screen or an operation of the application 370. The multimedia manager 343 may recognize a format required to reproduce various media files, and may use a codec suitable for the format to perform encoding or decoding of the media file. The resource manager 344 may manage a resource (e.g., a source code, a memory, a storage space, etc.) of at least any one of the applications 370.

The power manager 345 may manage, for example, a battery or power by operating together with a Basic Input/Output System (BIOS), or the like, and may provide power information or the like required for the operation. The database manager 346 may manage to generate, search, or change a database to be used in at least one application among the applications 370. The package manager 347 may manage an installation or update of an application distributed in a form of a package file.

The connectivity manager 348 may manage, for example, a wireless connection such as WiFi, Bluetooth, or the like. The notification manager 349 may display or notify an event such as an incoming message, an appointment, a proximity notification, or the like, in a manner of not disturbing the user. The location manager 350 may manage location information of the electronic device. The graphic manager 351 may manage a graphic effect to be provided to the user or a user interface related thereto. The security manager 352 may provide a general security function required for system security, user authentication, or the like. According to various embodiments, if the electronic device (e.g., the electronic device 101) includes a telephone function, the middleware 330 may further include a telephony manager for managing a voice or video telephony function of the electronic device.

The middleware 330 may include a middleware module for forming a combination of various functions of the aforementioned constitutional elements. The middleware 330 may provide a module specified for each type of operating system to provide a differentiated function. Further, the middleware 330 may dynamically delete some of the existing constitutional elements or may add new constitutional elements.

The API 360 (e.g., the API 145) is, for example, a set of API programming functions, and may be provided with other configurations according to an operating system. For example, in case of Android or IOS, one API set may be provided for each platform, and in case of Tizen, two or more API sets may be provided.

The application 370 (e.g., the application program 147) may include one or more applications capable of providing a function of, for example, a home 371, a dialer 372, a Short Message Service (SMS)/Multimedia Messaging Service (MMS) 373, an Instant Message (IM) 374, a browser 375, a camera 376, an alarm 377, a contact 378, a voice dial 379, an e-mail 380, a calendar 381, a media player 382, an album 383, a clock 384, a health care (e.g., an application for measuring a physical activity level, a blood sugar level, etc.), or providing of environment information (e.g., providing of atmospheric pressure, humidity, or temperature information).

According to one embodiment, the application 370 may include an application (for convenience of explanation, hereinafter, referred to as an "information exchange application") for supporting information exchange between the electronic device (e.g., the electronic device 101) and an external electronic device (e.g., the electronic device 102 or 104). The information exchange application may include, for example, a notification relay application for relaying specific information to the external electronic device or a device management application for managing the external electronic device.

For example, the notification relay application may include a function of relaying notification information generated in another application (e.g., an SMS/MMS application, an e-mail application, a health care application, an environment information application, etc.) of the electronic device to the external electronic device (e.g., the electronic device 102 or 104). Further, the notification relay application may receive notification information, for example, from the external electronic device and may provide it to the user.

The device management application may manage (e.g., install, delete, or update), for example, at least one function (e.g., turning on/turning off the external electronic device itself (or some components thereof) or adjusting of a display illumination (or a resolution)) of an external electronic device (e.g., the electronic device 104) which communicates with the electronic device, an application which operates in the external electronic device, or a service (e.g., a call service or a message service) provided by the external electronic device.

According to one embodiment, the application 370 may include an application (e.g., a health management application or the like of a mobile medical device) designated according to an attribute of an external electronic device (e.g., the electronic device 102 or 104). According to various embodiments, the application 370 may include an application received from the external electronic device (e.g., the server 106 or the electronic device 102 or 104). According to various embodiments, the application 370 may include a preloaded application or a third party application that can be downloaded from the server. A name of components of the program module 310 according to the illustrated embodiment may vary depending on a type of an operating system.

According to various embodiments, at least some parts of the program module 310 may be implemented in software, firmware, hardware, or at least two or more of combinations thereof. At least some parts of the programming module 310 may be implemented (e.g., executed), for example, by a processor (e.g., the processor 210). At least some parts of the programming module 310 may include, for example, modules, programs, routines, sets of instructions, processes, or the like for performing one or more functions.

A term "module" used in the present document may imply a unit including, for example, one of hardware, software, and firmware or a combination of two or more of them. The "module" may be interchangeably used with a term such as a unit, a logic, a logical block, a component, a circuit, and the like. The "module" may be a minimum unit of an integrally constituted component or may be a part thereof. The "module" may be a minimum unit for performing one or more functions or may be a part thereof. The "module" may be mechanically or electrically implemented. For example, the "module" may include at least one of an Application-Specific Integrated Circuit (ASIC) chip, a Field-Programmable Gate Arrays (FPGAs), and a programmable-logic device, which are known or will be developed and which perform certain operations.

According to various embodiments, at least some parts of a device (e.g., modules or functions thereof) or method (e.g., operations) may be implemented with an instruction stored in a computer-readable storage media for example. If the instruction is executed by one or more processors (e.g., the processor 120), the one or more processors may perform a function corresponding to the instruction. The computer-readable storage media may be, for example, the memory 130.

The computer readable recording medium may be a hardware device configured particularly to store and perform a program instruction (e.g., program module), for example, a hard disk, a magnetic medium such as a floppy disc and a magnetic tape, an optical storage medium such as a Compact Disc-ROM (CD-ROM) or a Digital Versatile Disc (DVD), a magnetic-optic medium such as a floptical disc, a Read Only Memory (ROM), a Random Access Memory (RAM), a flash memory, and the like. An example of the program instruction includes not only a machine language created by a compiler but also a high-level language executable by a computer by using an interpreter or the like. The aforementioned hardware device may be configured to operate as one or more software modules to perform the operation of various embodiments of the present disclosure, and the other way around is also possible.

The module or programming module according to various embodiments may further include at least one or more constitutional elements among the aforementioned constitutional elements, or may omit some of them, or may further include additional other constitutional elements. Operations performed by a module, programming module, or other constitutional elements according to various embodiments may be executed in a sequential, parallel, repetitive, or heuristic manner. In addition, some of the operations may be executed in a different order or may be omitted, or other operations may be added. In addition, an embodiment included in the present document is provided for explaining and understanding technical features, not for limiting the scope of the present disclosure. Therefore, all changes based on the technical features of the present document or various other embodiments will be construed as being included in the scope of the present document.

In the following embodiment, an x-axis, a y-axis, and a z-axis are not limited to three axes on an orthogonal coordinate system, and may be interpreted in a broad sense including this. For example, the x-axis, the y-axis, and the z-axis may be orthogonal to each other, but may refer to different directions not orthogonal to each other.

Meanwhile, when a variety of constitutional elements such as a layer, a film, a region, a plate, or the like are referred to as being "on" another constitutional element, this may include not only a case where it can be "directly on" the other constitutional element but also a case where other constitutional elements are present therebetween or where the constitutional element is included inside the other constitutional element.

Figure 4:
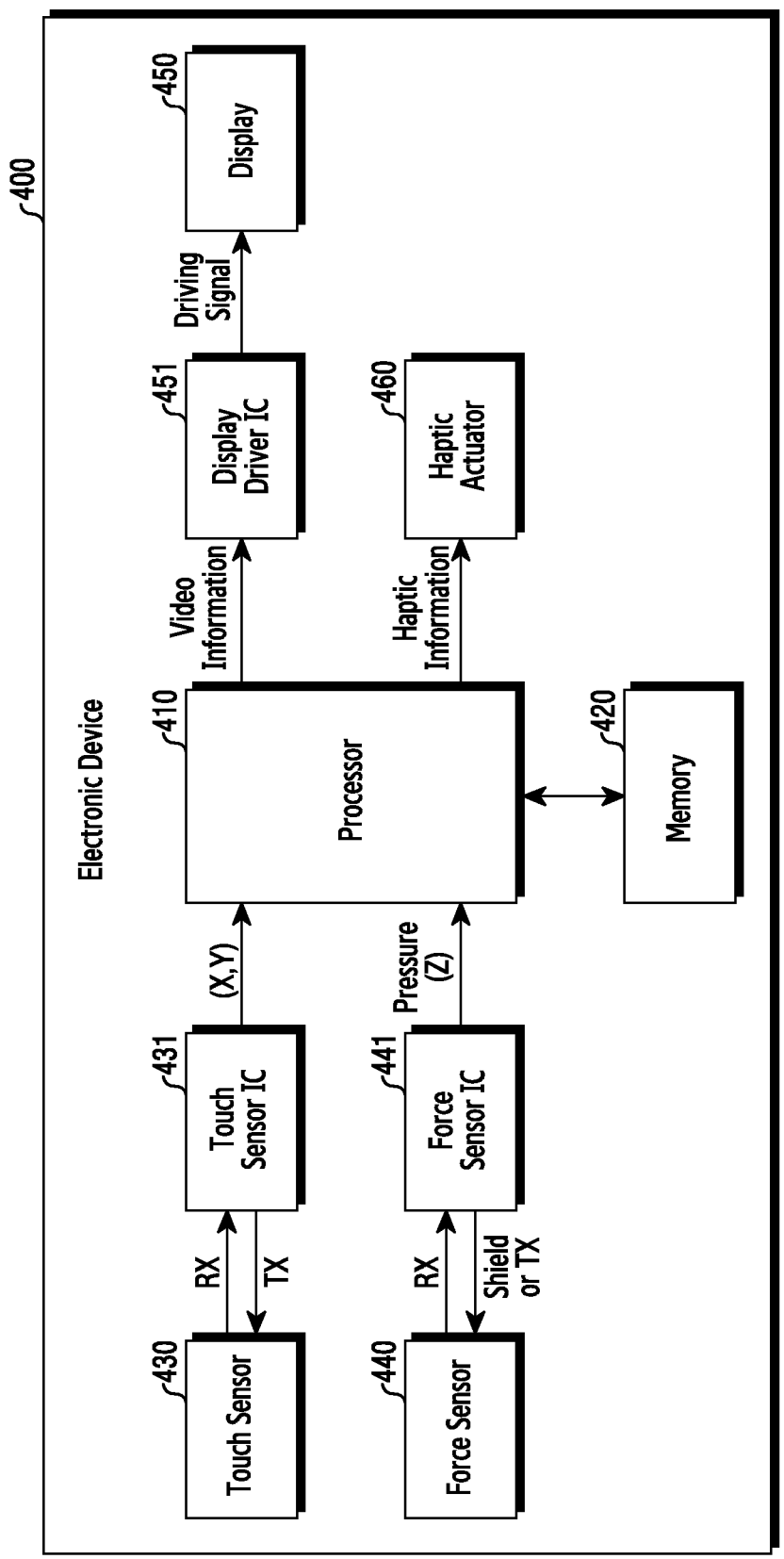
FIG. 4 is a block diagram of an electronic device according to one embodiment of the present disclosure.

FIG. 4 is a block diagram of an electronic device according to one embodiment.

Referring to FIG. 4, an electronic device 400 may include, for example, one or more processors 410, a memory 420, a touch sensor 430, a touch sensor Integrated Circuit (IC) 431, a pressure sensor 440, a pressure sensor IC 441, a display 450, a display driver IC 451, and a haptic actuator 460.

The processor 410 may include one or more of a central processing unit, an application processor, and a Communication Processor (CP). For example, the processor 410 may execute arithmetic operations or data processing for control and/or communication of different constitutional elements of the electronic device 400. The processor 410 may control a plurality of hardware or software constitutional elements connected to the processor 410 by driving, for example, an operating system or one or more application programs, and may process a variety of data including multimedia data and may perform arithmetic operations. The processor 410 may be implemented, for example, with a System on Chip (SoC). According to other embodiments, the processor 410 may further include a Graphic Processing Unit (GPU) and/or an image signal processor.

The processor 410 may receive from the touch sensor IC 431 a position signal (e.g., a coordinate (X, Y)) detected by the touch sensor 430. The processor 410 may receive from the pressure sensor IC 441 a pressure signal (e.g., a pressure coordinate (X, Y) and/or a pressure strength (Z)) detected by the pressure sensor 440. The processor 410 may synchronize the position signal of the touch sensor 430 and the pressure signal of the pressure sensor 440. When the processor 410 must process the touch signal and the pressure signal together, and because the signals are generated is detected by different entities, i.e., the touch sensor 430 and the pressure sensor 440, the signals may be synchronized prior to processing. For example, the touch signal is detected when the display 450 is touched, and may be generated without the pressure signal. When the pressure signal is generated, the processor 410 may synchronize the touch signal and the pressure signal and process them as one input. Although the pressure signal generally is generated when the touch signal is also generated, in certain situations (e.g., when a touch is made by a user with a glove, when the display 450 is wet, or the like), the pressure signal may be detected without the touch signal. In this case, the processor 410 may process only the pressure signal as one input without synchronization with the touch signal.

The processor 410 may transmit video information to the display driver IC 451, and the display driver IC 451 may transmit a driving signal for driving the display 450 to the display 450 according to the video information. The processor 410 may transmit haptic information to the haptic actuator 460. For example, the video information and the haptic information may be determined on the basis of a position signal (e.g., a coordinate (X, Y)) received from the touch sensor IC 431 and/or a pressure coordinate (X, Y) or a pressure strength (Z)) received from the pressure sensor IC 441). For example, the processor 410 may transmit first video information (e.g., a popup window related to a touch object) to the display 450 if the pressure strength included in the received pressure signal exceeds a first threshold, and may transmit second video information (e.g., a full screen related to the touch object) to the display 450 if the pressure strength exceeds a second threshold greater than the first threshold. As another example, the processor 410 may transmit first haptic information (e.g., a vibration of a first strength) to the haptic actuator 460 if the pressure strength exceed the first threshold, and may transmit second haptic information (e.g., a vibration of a second strength greater than the first strength) to the haptic actuator 460 if the pressure strength exceeds the second threshold greater than the first threshold.

The memory 420 may include a volatile and/or non-volatile memory. The memory 420 may store, for example, an instruction or data related to at least one other constitutional element of the electronic device 400. According to various embodiments, the memory 420 may store a software and/or a program. The program may include, for example, a kernel, a middleware, an Application Programming Interface (API), an application program (or an "application"), or the like. At least one part of the kernel, middleware, or API may be referred to as an Operating System (OS). The kernel may control or manage, for example, system resources (e.g., the bus, the processor 410, the memory 420, or the like) used to execute an operation or function implemented in other programs (e.g., the middleware, the API, or the application program). Further, the kernel may provide an interface capable of controlling or managing the system resources by accessing individual constitutional elements of the electronic device 400 in the middleware, the API, or the application program.

The memory (e.g., the memory 420) may include, for example, an internal memory or an external memory. The internal memory may include, for example, at least one of a volatile memory (e.g., a Dynamic RAM (DRAM), a Static RAM (SRAM), a Synchronous Dynamic RAM (SDRAM), etc.) and a non-volatile memory (e.g., a One Time Programmable ROM (OTPROM), a Programmable ROM (PROM), an Erasable and Programmable ROM (EPROM), an Electrically Erasable and Programmable ROM (EEPROM), a mask ROM, a flash ROM, a flash memory (e.g., a NAND flash memory, a NOR flash memory, etc.), a hard drive, or a Solid State Drive (SSD)). The external memory may further include a flash drive, for example, Compact Flash (CF), Secure Digital (SD), Micro Secure Digital (Micro-SD), Mini Secure digital (Mini-SD), extreme Digital (xD), memory stick, or the like. The external memory may be operatively and/or physically connected to the electronic device 400 via various interfaces.

The touch sensor 430 may detect touch signals in a 2-dimensional coordinate. The touch sensor 430 may sense a touch position (X, Y). The touch sensor 430 may be, for example, an electrostatic type sensor, a pressure-sensitive type sensor, or an ultrasonic type sensor. The touch sensor 430 may further include a tactile layer and thus may provide the user with a tactile feedback. The touch sensor 430 may be implemented as a touch screen display by being embedded in the display 450.

The touch sensor IC 431 may be electrically connected to the touch sensor 430. The touch sensor IC 431 may drive the touch sensor 430. For example, the touch sensor IC 431 may provide a driving signal to the touch sensor 430, or may receive the driving signal from the touch sensor 430. The touch sensor IC 431 may transmit to the processor 410 the touch position (X, Y) detected from the touch sensor 430.

The pressure sensor 440 may detect a pressure strength for a user's touch. The pressure sensor 440 may detect a pressure value (Z) indicating the pressure strength at the touch position (X, Y). The pressure sensor 440 may detect pressure of an external object using first and second electrodes insulated from each other by a dielectric layer.

The pressure sensor IC 441 may drive the pressure sensor 440 to detect the pressure strength based on a change in capacitance formed between the first electrode and the second electrode. The change in capacitance is caused by a change in distance between the first electrode and the second electrode due to pressure of the external object. The pressure sensor IC 441 may sense the change in the capacitance formed between the first electrode and the second electrode, for example, according to mutual capacitance and/or self capacitance of the electrodes. In case of mutual capacitance, the pressure sensor IC 441 may provide a transmission signal to the second electrode and receive a reception signal corresponding to the transmission signal from the first electrode. In case of self capacitance, the pressure sensor IC 441 may provide a stimulus signal to the first electrode, and may connect the second electrode to ground. The pressures sensor IC 441 may transmit to the processor 410 the pressure strength detected from the pressure sensor 440.

The display 450 may include various types of displays, for example, a Liquid Crystal Display (LCD), a Light Emitting Diode (LED) display, an Organic Light-Emitting Diode (OLED) display, a MicroElectroMechanical Systems (MEMS) display, or an electronic paper display. The display 450 may display, for example, a variety of contents (e.g., text, image, video, icon, symbol, or the like) to the user. The display 450 may include a touch screen, and may receive a touch, gesture, proximity, or hovering input caused by, for example, a stylus pen or a part of a user's body.

The display driver IC 451 may receive video information from the processor 410. The display driver IC 451 may transmit to the display 450 a driving signal for driving the display 450 according to the received video information.

The haptic actuator 460 may convert an electric signal into mechanical vibration to generate a vibration or haptic effect. The haptic actuator 460 may provide a vibrational or haptic feedback sensation to the user, for example when the user presses the electronic device 400. The haptic actuator 460 may receive haptic information from the processor 410. The haptic actuator 460 may generate the vibration or haptic effect according to the received haptic information.

The electronic device 400 may include a mobile TV supporting device (e.g., a GPU) capable of handling media data according to a protocol of, for example, Digital Multimedia Broadcasting (DMB), Digital Video Broadcasting (DVB), media flow, or the like. Each of the constitutional elements described in the present document may consist of one or more components, and names thereof may vary depending on a type of the electronic device. According to various embodiments, some of the constitutional elements of the electronic device (e.g., the electronic device 400) may be omitted, or additional other constitutional elements may be further included. Further, some of the constitutional elements of the electronic device may be combined and constructed as one entity while performing the same functions of corresponding constitutional elements as before they are combined.

Figure 5A:
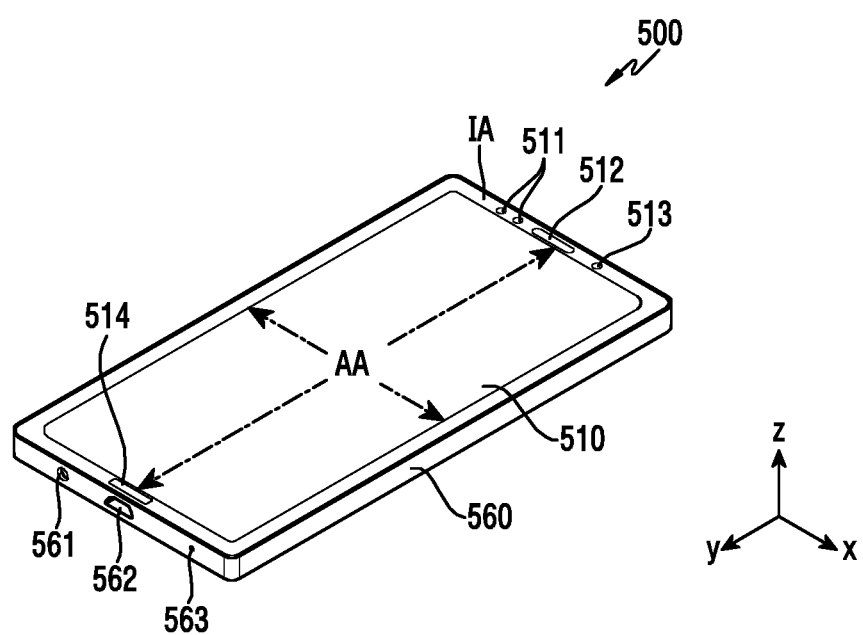
FIG. 5A is a perspective view of an electronic device according to one embodiment of the present disclosure.
Figure 5B:
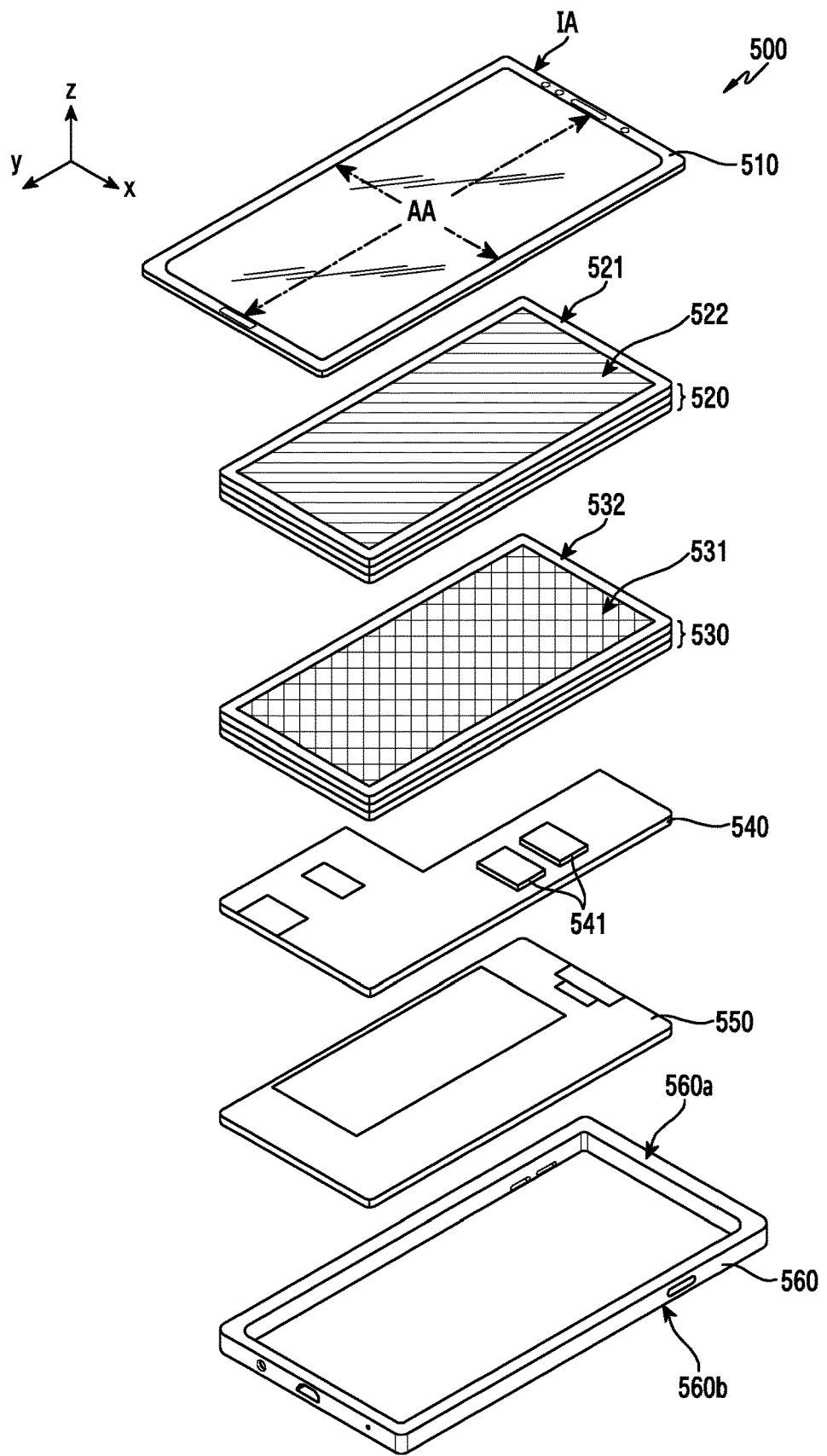
FIG. 5B is an exploded perspective view of an electronic device according to one embodiment of the present disclosure.

FIG. 5A is a perspective view of an electronic device according to one embodiment of the present disclosure. FIG. 5B is an exploded perspective view of an electronic device according to one embodiment of the present disclosure.

Referring to FIG. 5A and FIG. 5B, an electronic device 500 according to one embodiment may include a transparent cover 510, a housing 560, a display 520, a pressure sensor 530, a Printed Circuit Board (PCB) 540, an inner support construction 550, or the like.

According to one embodiment, the housing 560 may include a first surface 560a facing a first direction (+Z) (i.e. the front surface of the housing) and a second surface 560b facing a second direction (−Z) opposite to the first direction (+Z) (i.e. the back surface of the housing). The housing 560 may accommodate the display 520, the pressure sensor 530, the PCB 540, the inner support construction 550, or the like. The display 520 may be disposed between the first surface 560a and second surface 560b of the housing 560. The pressure sensor 530 may be disposed between the display 520 and the second surface 560b of the housing 560. The PCB 540 may be disposed between the pressure sensor 530 and the second surface 560b of the housing 560. The inner support construction 550 may be disposed between the PCB 540 and the second surface 560b of the housing 560.

According to one embodiment, the housing 560 may be made of materials such as plastic, glass, ceramic, carbon fiber composites and other composites, metals, combinations of these materials, etc. The electronic device 500 may be formed of a unibody construction in which most or all parts of the housing 560 are a single structure (e.g., a mechanically processed metal component or a molded plastic component). Alternatively, the electronic device 500 may consist of a plurality of housing constructions.

According to one embodiment, the transparent cover 510 may constitute at least one part of the first surface 560a of the housing 560, such that the transparent cover 510 constitutes one exterior of the electronic device 500. The transparent cover 510 may be the front surface of the electronic device 500. The transparent cover 510 may protect various constitutional elements disposed within the housing 560. The transparent cover 510 may be divided into an Active Area (AA) and an Inactive Area (IA), where the IA may be a bezel disposed around the AA. For example, the transparent cover 510 may include an AA having a square shape, and may include an IA having a closed-loop shape that surrounds the square-shaped AA. The embodiment is not limited thereto, and thus the transparent cover 510 may be divided into AAs having various shapes and IAs corresponding thereto.

According to one embodiment, the electronic device 500 may include various constitutional elements for performing a variety of functions. For example, an interface connector port 562 may be disposed to one lateral surface of the housing 560. The electronic device 500 may be connected to an external device for performing a data transmission/reception function through the interface connector port 562. Alternatively, the electronic device 500 may be charged by using external power supplied through the interface connector port 562. An ear-jack hole 561 and a microphone device 563 for capturing the user's voice may also be disposed around the interface connector port 562.

According to one embodiment, the electronic device 500 may further include at least one sensor module 511, a speaker 512 for outputting audio such as a counterparty's voice during a phone call, a camera unit 513, a key button 514, or the like. Although not shown in FIG. 5A, the at least one sensor module 511, the speaker 512, the camera unit 513, and the key button 514 may be disposed to overlap with the AA of the electronic device. For example, the key button 514 may be implemented as a soft-key touch button displayed in the AA of the display 520. Similarly, the camera unit 513 may be mounted to partially overlap with a portion of the display in the AA. Thus, the width of the IA may be decreased by such an arrangement, and the AA may constitute the vast majority of the front surface of the electronic device 500. Accordingly, the display 520 may be exposed through substantially the entirety of the transparent cover 510. In other words, the electronic device 500 may be substantially bezel-less.

According to various embodiments, as an internal constitutional element of the electronic device 500, the display 520 may include a Liquid Crystal Display (LCD), a Light Emitting Diode (LED) display, an Organic Light-Emitting Diode (OLED) display, a MicroElectroMechanical Systems (MEMS) display, or an electronic paper display. According to one embodiment, the display 520 may further include a touch screen layer. The touch screen layer may include an electrostatic type sensor, a pressure-sensitive type sensor, or an ultrasonic type sensor. In addition, the touch screen layer may be implemented as an add-on type, an on-cell type, or an in-cell type, and may be integrated in the display 520 in other manners. That is, the display 520 may be touch sensitive.

The display 520 according to one embodiment may include a first AA 521 for displaying information to a user. For this, the display 520 may include touch screen display components (e.g., OLED components, an OLED, light generating components, image generating components, a touch sensing electrode, etc.) on the first AA 521. In addition, the first AA 521 may correspond to the AA of the transparent cover 510. That is, the first AA 521 may overlap with the AA of the transparent cover 510 when viewed in a top view of the electronic device 500, i.e. in a −Z direction towards the first surface 560a. Therefore, the display 520 may be exposed through the AA of the transparent cover 510, and may detect a touch position (X, Y) of an external object on the AA of the transparent cover 510. Meanwhile, the display 520 may include a boundary area 522 disposed around the first AA 521. The boundary area 522 of the display 520 may include a circuit or the like such as a signal wiring. The boundary area of the display 520 may be referred to as a first IA 522.

The pressure sensor 530 according to one embodiment may include a second AA 531 capable of sensing pressure of the external object on the electronic device 500. For this, the pressure sensor 530 may include pressure sensing components (e.g., a first conductive electrode, a second conductive electrode) on the second AA 531. In addition, the second AA 531 may correspond to the AA of the transparent cover 510. That is, the second AA 531 may overlap with the AA of the transparent cover 510 when viewed in the top view. Therefore, the pressure sensor 530 may detect a pressure signal (e.g., a pressure coordinate (X, Y) or a pressure strength (Z)) of the external object on the AA of the transparent cover 510. Meanwhile, the pressure sensor 530 may include a boundary area 532 disposed around the second AA 531. The boundary area 532 of the pressure sensor 530 may include a circuit or the like such as a signal wiring. Therefore, the boundary area of the pressure sensor 530 may be referred to as the second IA 532.

According to one embodiment, a variety of electronic components 541 or the like may be mounted on the PCB 540. The PCB 540 may be separated by a specific interval from the pressure sensor 530 so that there is sufficient space to mount the variety of the electronic components 541. Meanwhile, the PCB 540 may be electrically connected to various constitutional elements including the display 520 and the pressure sensor 530. For example, the PCB 540 may be electrically connected to the display 520 and the pressure sensor 530 through various conductive connection members (e.g., an FPCB, a C-clip, a Fogo-pin).

As shown in FIG. 5B, the electronic device 500 according to one embodiment may include the first AA 521 of the display 520 corresponding to the AA of the transparent cover 510 and the second AA 531 of the pressure sensor 530. That is, the display 520 and the pressure sensor 530 may be substantially activated on the AA of the transparent cover 510. Meanwhile, the IA of the transparent cover 510 may be opaque. Therefore, the IA of the transparent cover 510 may prevent signal wirings and various conductive connection members of the display 520 and the pressure sensor 530 from being seen by a user. The IA of the transparent cover 510 may be formed with an opaque masking layer such as a black ink layer, an opaque metal layer, or the like.

According to one embodiment, in order to reduce a width of the IA of the transparent cover 510, various conductive connection members for electrically connecting the display 520 and the pressure sensor 530 to the PCB 540 may be disposed to at least partially overlap with the AA when viewed in the top view. That is, mutual electrical connection paths of the PCB 540 and the display 520 and/or the pressure sensor 530 may be provided in an area at least partially overlapping with the AA. Specifically, the width of the IA of the electronic device 500 may be decreased when structures such as conductive connection members are not disposed in the IA of the display 520 or the pressure sensor 530. Therefore, the area of the AA may be maximized, such that the display 520 may constitute substantially the entirety of the transparent cover 510. In other words, the electronic device 500 may be substantially bezel-less.

According to one embodiment, the inner support construction (e.g., bracket) 550 may support inner structures of the electronic device 500. The inner support construction 550 may strengthen overall stiffness of the electronic device 500. For example, at least one metallic material, such as Al, Mg, and STS, may be used for the inner support construction 550. Alternatively, the inner support construction 550 may include highly rigid plastic which contains glass fiber. Alternatively, the inner support construction 550 may be made of both metal and plastic. When the inner support construction 550 is made of both metal and non-metal, the non-metal member may be insert-injected to the metal member. The inner support construction 550 may support constitutional elements such as the display 520, the input sensor 530, the PCB 540, and the like together with the housing 560. In addition, an elastic member such as a sponge or a rubber or an adhesive layer such as a double-sided tape may be further disposed between the inner support construction 550 and the display 520 to protect the display 520.

Figure 6:
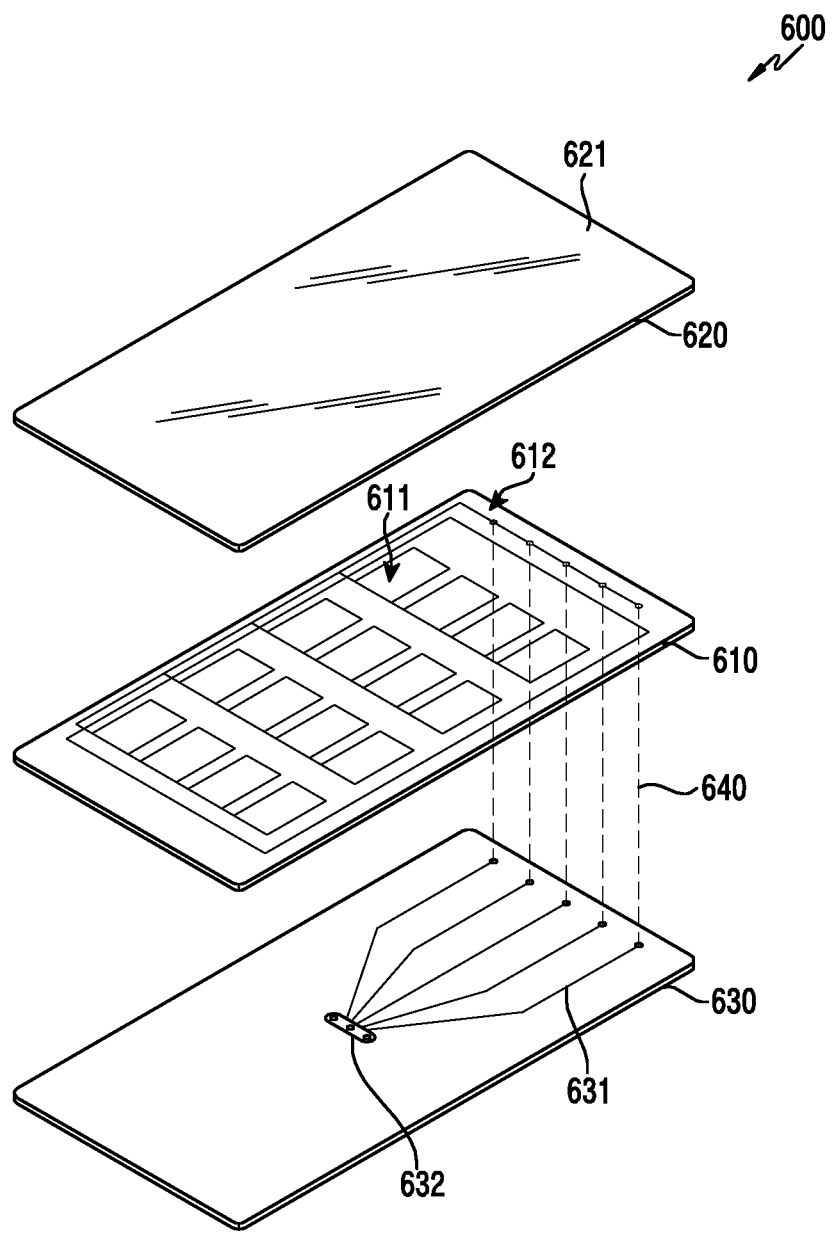
FIG. 6 is an exploded perspective view of a pressure sensor according to one embodiment of the present disclosure.

FIG. 6 is an exploded perspective view of a pressure sensor according to one embodiment.

A pressure sensor 600 of FIG. 6 may be a device similar or identical to the pressure sensor 530 of FIG. 5B.

Referring to FIG. 6, the pressure sensor 600 according to one embodiment may include a first electrode layer 610, a second electrode layer 620, a support member 630, and a plurality of wirings 631 disposed on the support member 630. The second electrode layer 620, the first electrode layer 610, and the support member 630 may be laminated sequentially along the second direction (−Z). That is, the second electrode layer 620 may be separated from the first electrode layer 610 in a first direction (+Z), and may be in parallel with the first electrode layer 610. In addition, the support member 630 may be separated from the first electrode layer 610 in the second direction (−Z), and may be in parallel with the first electrode layer 610. In other words, the first electrode layer 610 may be disposed between the second electrode layer 620 and the support member 630. However, the embodiment is not limited thereto, and thus the first electrode layer 610, the second electrode layer 620, and the support member 630 may be laminated in various orders.

According to one embodiment, the pressure sensor 600 may include an AA 611 capable of sensing an external object. The pressure sensor 600 may measure a capacitance change depending on a gap change between the first electrode layer 610 and the second electrode layer 620, and may detect a pressure signal (e.g., a pressure coordinate (X, Y) or a pressure strength (Z)) based on the capacitance change. For this, the first electrode layer 610 may include a first electrode in the AA 611 in which the pressure change is detected. For example, the first electrode may include a plurality of patterns of various shapes, for example, a square pattern, a circular pattern, or a diamond shape pattern. The first electrode may include various conductive materials. For example, the first electrode layer 610 may be made of Indium Tn Oxide (ITO), Indium Zinc Oxide (IZO), copper oxide, Poly(3,4-ethylenedioxythiophene) (PEDOT), metal mesh, Carbon Nano Tube (CNT), Ag nanowire, transparent polymer conductor, graphene, etc. Meanwhile, the second electrode layer 620 may be implemented as a ground layer. For example, the second electrode layer 620 may include a grounded metal sheet. For example, the second electrode layer 620 may be a copper sheet or the like. In this case, the second electrode layer 620 may be implemented as a ground layer by being electrically connected to the support member 630 through a conductive via. In this implementation, the pressure sensor 600 may detect pressure by using self capacitance.

According to one embodiment, the pressure sensor 600 may include a dielectric layer between the first electrode layer 610 and the second electrode layer 620. The dielectric layer may include an insulation material. For example, it may consist of recon, air, foam, membrane, Optical Clear Adhesive (OCA), sponge, rubber, ink, polymer (e.g., PolyCarbonate (PC), PolyEthylene Terephthalate (PET), etc. The dielectric layer has elastic force or restoring force so that its thickness can be changed and restored according to pressure of the external object.

Meanwhile, the pressure sensor 600 may include an IA 612 disposed to the surrounding area of the AA 611. The pressure sensor 600 may include a signal wiring circuit or the like in the IA 612 that is electrically connected to the first electrode layer 610 and the second electrode layer 620. The signal wiring circuit may include, for example, a conductive via 640. The conductive via 640 may be formed by drilling (e.g., mechanical drilling or layer drilling) an opening which penetrates at least one of the first electrode layer 610, the second electrode layer 620, and the support member 630 and coating the inner portion of the opening with a conductive material. The conductive via 640 may provide an electrical connection between the first electrode layer 610 and the plurality of wirings 631 on the support member 630.

The support member 630 may be made of, for example, or combinations of acrylic, PolyCarbonate (PC), PolyMethyl MethAcrylate (PMMA), PolyImide (PI), PolyEthylene Terephthalate (PET), PolyPropylene Terephthalate (PPT), Amorphous PolyEthylene Terephthalate (APET), Polyethylene Naphthalate Terephthalate (PNT), PolyEthylene Terephthalate Glycol (PETG), Tri-Acetyl-Cellulose (TAC), Cyclic Olefin Polymer (COP), Cyclic Olefin Copolymer (COC), poly-DicyCloPentaDiene (DCPD), CycloPentDienyl anions (CPD), PolyARylate (PAR), PolyEtherSulfone (PES), Poly Ether Imide (PEI), a modified epoxy resin, an acrylic resin, etc. In addition, the support member 630 may further include a conductive contact 632 (i.e. an electrically conductive connection member). The conductive contact 632 may include a conductive via which penetrates at least one part of the support member 630. The conductive contact 632 may be disposed on the support member 630 to overlap with at least one part of the AA 611 when the pressure sensor 600 is viewed from the top, i.e. in the second direction (−Z). The plurality of wirings 631 on the support member 630 may be connected to the conductive contact 632. Therefore, the first electrode layer 610 may be electrically connected to the conductive contact 632 through the conductive via 640 and the plurality of wirings 631. The conductive contact 632 may be electrically connected to a PCB. Therefore, the pressure sensor 600 may be electrically connected to the PCB through the conductive contact 632 disposed to an area that at least partially overlap with the AA 611. In other words, the pressure sensor 600 may be electrically connected to the PCB through the conductive contact 632 disposed to penetrate the support member 630.

However, the embodiment is not limited thereto, and thus according to other embodiments, the second electrode layer 620 may not be the ground layer, and may include a second electrode in which a pressure change can be detected. The second electrode may include a plurality of patterns of various shapes, for example, a square pattern, a circular pattern, or a diamond shape pattern. In addition, one of the first electrode and the second electrode may include a first direction pattern TX, and the other one may include a second direction pattern RX orthogonal to the first direction. In this case, the pressure sensor 600 may detect pressure using mutual capacitance. Meanwhile, the pressure sensor 600 may further include a plurality of different wirings on the support member 630, and may further include a different conductive via for electrically connecting the plurality of different wirings and the second electrode layer 620. In addition, the plurality of different wirings may be electrically connected to the PCB by being electrically connected to the conductive contact 632 or another conductive contact. That is, the support member 630 may include a plurality of electrical connection paths to which a plurality of constitutional elements of the pressure sensor 600 and the PCB can be electrically connected.

Figure 7A:
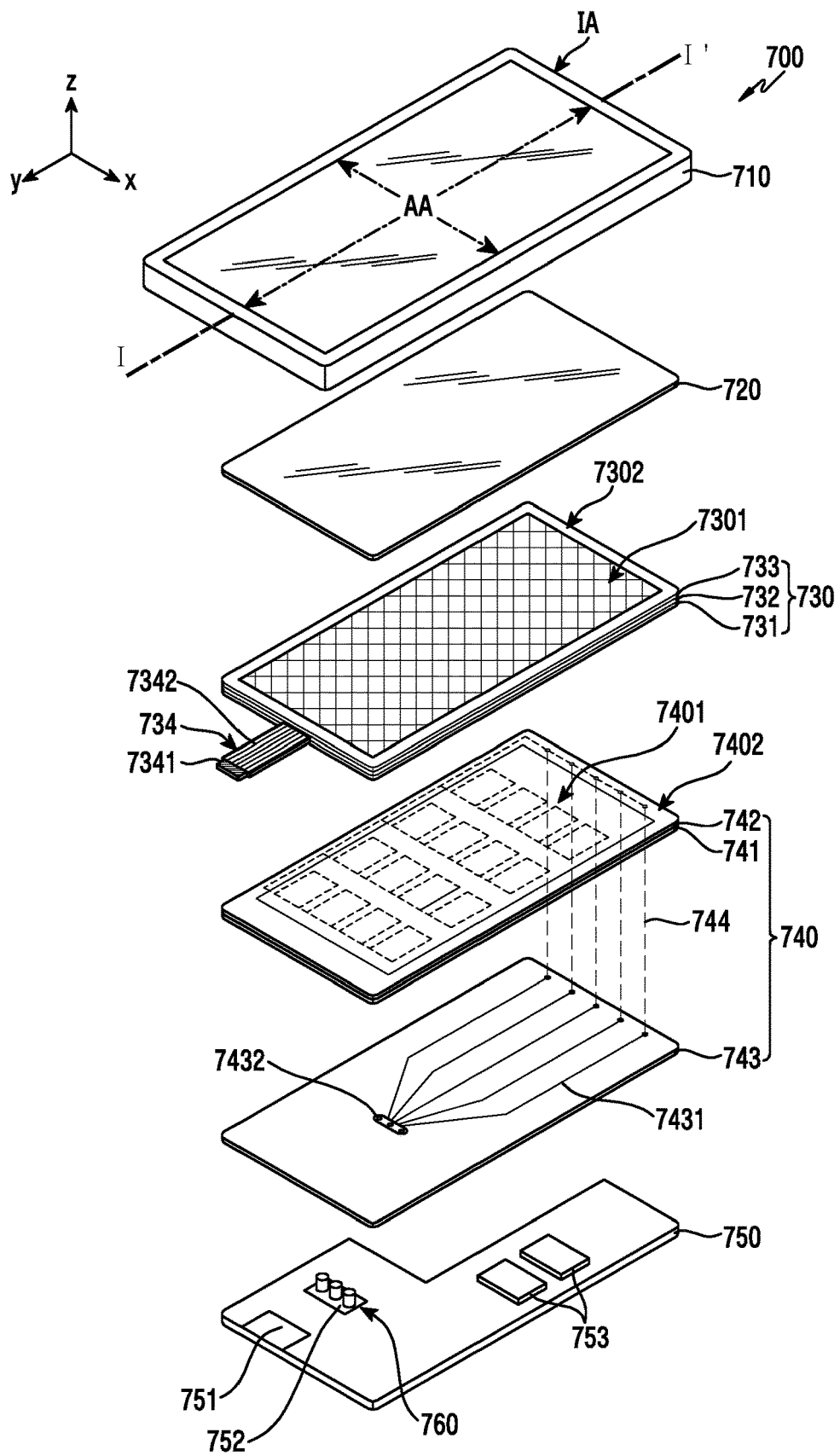
FIG. 7A is an exploded perspective view of an electronic device according to one embodiment of the present disclosure.
Figure 7B:
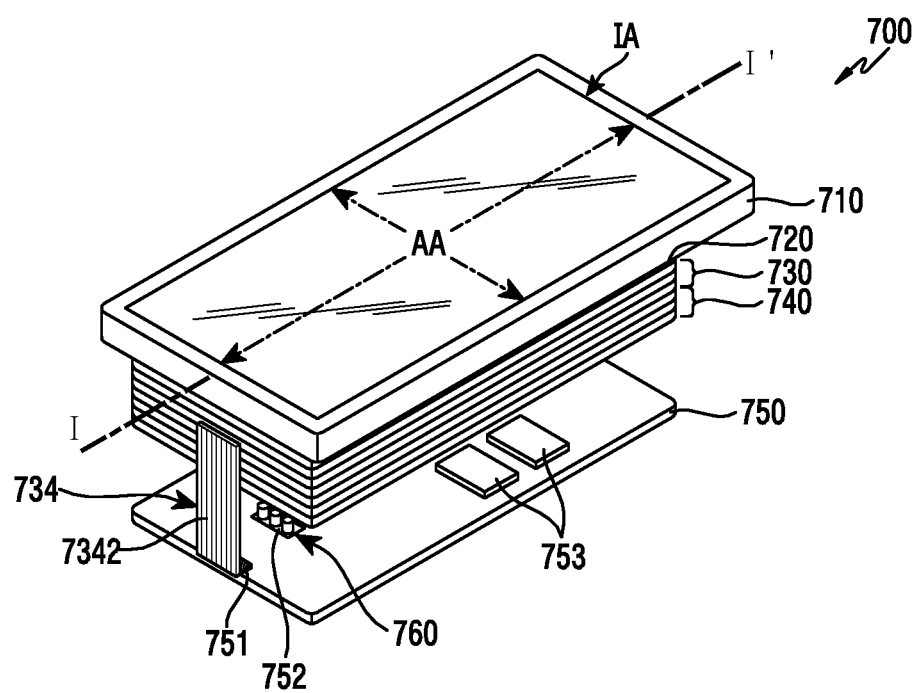
FIG. 7B is an exploded perspective view of an electronic device according to one embodiment of the present disclosure.
Figure 7C:
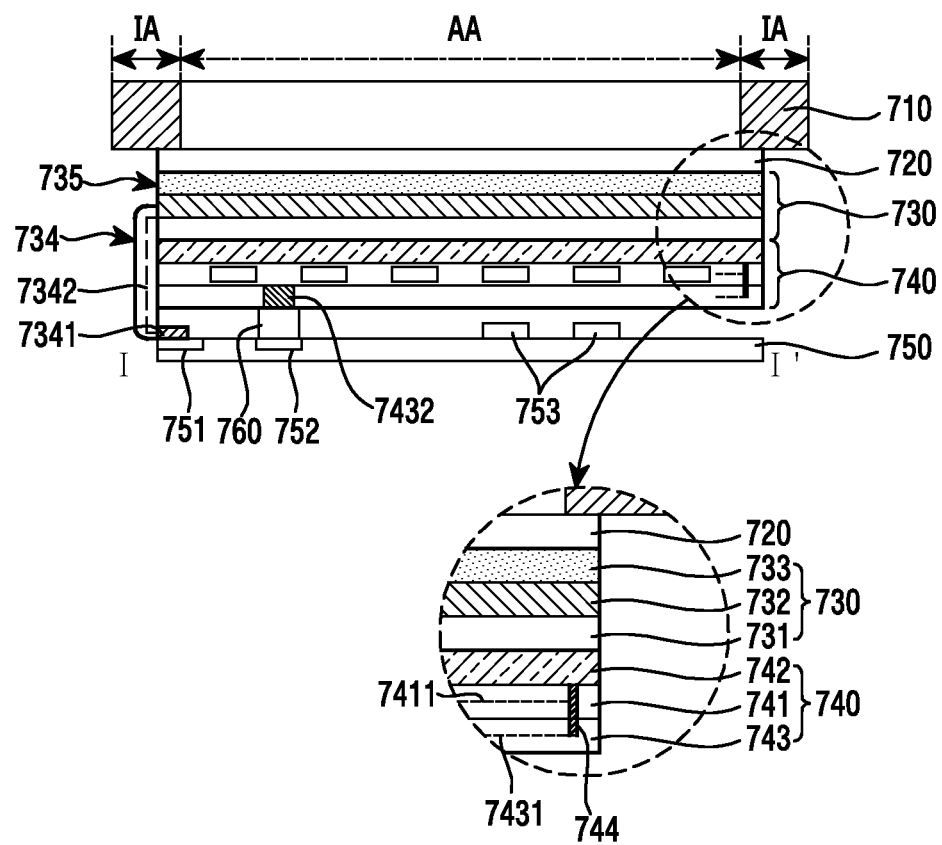
FIG. 7C illustrates a cross-sectional view cut along the line I-I' of FIG. 7A and FIG. 7B according to one embodiment of the present disclosure.

FIG. 7A is an exploded perspective view of an electronic device according to one embodiment of the present disclosure. FIG. 7B is an exploded perspective view of an electronic device according to one embodiment of the present disclosure. FIG. 7C illustrates a cross-sectional view cut along the line I-I' of FIG. 7A and FIG. 7B according to one embodiment of the present disclosure.

Referring to FIG. 7A to FIG. 7C, an electronic device 700 may include a transparent cover 710, a polarizing layer 720, a display 730, a pressure sensor 740, a PCB 750, or the like. The transparent cover 710, the polarizing layer 720, the display 730, the pressure sensor 740, the PCB 750, or the like may be sequentially disposed along the second direction (−Z).

According to one embodiment, the transparent cover 710 has a central first AA. In addition, the transparent cover 710 has a first IA which surrounds the first AA. The display 730 may be exposed through the first AA of the transparent cover 710. The pressure sensor 740 may sense pressure of an external object on the first AA. That is, the display 730 and the pressure sensor 740 may be active in the first AA.

The polarizing layer 720 may polarize the light incident through the first AA and the light reflected from the display 730. The polarizing layer 720 may further include a phase layer, and the phase layer may be disposed adjacent to the display 730 to adjust the phase of the incident light and the reflected light, thereby allowing the content displayed in the display 730 to be more visible.

The display 730 may include a first display layer 731, a second display layer 732, and a touch screen layer 733. The first display layer 731, the second display layer 732, and the touch screen layer 733 may be sequentially disposed along the first direction (+Z). That is, the second display layer 732 may be separated from the first display layer 731 in the first direction (+Z), and may be in parallel with the first display layer 731. The touch screen layer 733 may be separated from the second display layer 732 in the first direction (+Z), and may be in parallel with the second display layer 732. In other words, the second display layer 732 may be disposed between the first display layer 731 and the touch screen layer 733. According to one embodiment, the first display layer 731 or the second display layer 732 may include any one or combinations of glass, Acrylonitrile Butadiene Styrene (ABS), acrylic, PolyCarbonate, (PC), PolyMethyl Meth-Acrylate (PMMA), PolyImide (PI), PolyEthylene Terephthalate (PET), PolyPropylene Terephthalate (PPT), Amorphous PolyEthylene Terephthalate (APET), PolyEthylene Naphthalate Terephthalate (PNT), PolyEthylene Terephthalate Glycol (PETG), Tri-Acetyl-Cellulose (TAC), Cyclic Olefin Polymer (COP), Cyclic Olefin Copolymer (COC), poly-DicyCloPentaDiene (DCPD), CycloPentDienyl anions (CPD), PolyARylate (PAR), PolyEtherSulfone (PES), Poly Ether Imide (PEI), modified epoxy resin, acrylic resin, etc. In addition, the second display layer 732 may include an encapsulation structure to prevent penetration of external moisture or oxygen into the display 730. For example, the encapsulation structure may include an organic material or an inorganic material, where the organic material and the inorganic material are sequentially and repetitively laminated.

According to one embodiment, the display 730 may include a second AA 7301 for displaying information to the user. For this, the display 730 may include various display components on the first display layer 731 and/or the second display layer 732. In addition, the second AA 7301 may correspond to the first AA of the transparent cover 710. Therefore, the display 730 may be exposed through the first AA and the touch screen layer 733 may detect touch positions (X, Y) of an external object on the first AA. Meanwhile, the display 730 may also include the second IA 7302 disposed around the second AA 7301. The second IA 7302 may be where components such as circuits, signal wiring, etc. are disposed.

According to one embodiment, the display 730 may include a Flexible Printed Circuit Board (FPCB) 734 extended from a lateral surface of the second IA 7302. The FPCB 734 may be coupled to the first display layer 731 or the second display layer 732 when they are separately manufactured, or may be integrally manufactured with the first display layer 731 or the second display layer 732. A first plurality of wirings 7342 may be disposed on the FPCB 734. The first plurality of wirings 7342 may electrically connect the circuits of the first display layer, second display layer, and touch screen layer, each of which are disposed on the second IA 7302, to the end portion 7341 of the FPCB 734. Referring to FIG. 7B and FIG. 7C, the FPCB 734 may be folded along the lateral surface 735 of the pressure sensor 740 and the display 730. Meanwhile, the end portion 7341 of the folded FPCB 734 may be connected to the first conductive contact 751 included in the PCB 750. Therefore, the display 730 may be electrically connected to the PCB 750 through the first plurality of wirings 7342 on the FPCB 734.

According to one embodiment, the pressure sensor 740 may include a first electrode layer 741, a second electrode layer 742, a support member 743, and a second plurality of wirings 7431. The second plurality of wirings 7431 may be disposed on the support member 743. The second electrode layer 742, the first electrode layer 741, and the support member 743 may be sequentially disposed along the second direction (−Z). That is, the second electrode layer 742 may be separated from the first electrode layer 741 in the first direction (+Z) and in parallel with the first electrode layer 741. The support member 743 may be separated from the first electrode layer 741 in the second direction (−Z) and in parallel with the first electrode layer 741. In other words, the first electrode layer 741 may be disposed between the second electrode layer 742 and the support member 743.

According to one embodiment, the pressure sensor 740 may include a third AA 7401 capable of sensing pressure of an external object. The pressure sensor 740 may measure a capacitance change depending on a gap change between the first electrode layer 741 and the second electrode layer 742, and may detect a pressure signal (e.g., a pressure coordinate (X, Y) or a pressure strength (Z)) based on the capacitance change. For this, the first electrode layer 741 may include a first electrode in the third AA 7401 in which the pressure change is detected, and the second electrode layer 742 may be a ground layer. In this case, the pressure sensor 740 may detect pressure by using self capacitance. However, the embodiment is not limited thereto, and thus the second electrode layer 742 may also include a second electrode layer that can detect pressure change. In this other case, the pressure sensor 740 may detect pressure by using mutual capacitance.

According to one embodiment, the pressure sensor 740 may include a dielectric layer between the first electrode layer 741 and the second electrode layer 742. The dielectric layer may include an insulation material. The dielectric layer has elastic force or restoring force so that its thickness can vary depending on the pressure applied by the external object.

Meanwhile, the pressure sensor 740 may include a third IA 7402 disposed in a surrounding area of the third AA 7401. The pressure sensor 740 may include a signal wiring circuit or the like in the third IA 7402 that is electrically connected to the first electrode layer 741 and the second electrode layer 742. The signal wiring circuit may include, for example, a conductive via 744. The conductive via 744 may provide an electrical connection between the signal wiring circuit of the first electronic layer 741 and the second plurality of wirings 7431 on the support member 743. The conductive via 744 may be formed by drilling (e.g., mechanical drilling or layer drilling) an opening which penetrates at least one of the first electrode layer 741, the second electrode layer 742, and the support member 743 and coating the inner portion of the opening with a conductive material.

The support member 743 may further include a second conductive contact 7432. The second conductive contact 7432 may include a conductive via which penetrates at least one part of the support member 743. The second conductive contact 7432 may be disposed to at least partially overlap with the AA 7401 when the pressure sensor 740 is viewed from the top, i.e. in the second direction (−Z). The second plurality of wirings 7431 on the support member 743 may be connected to the second conductive contact 7432. Therefore, the first electrode layer 741 may be electrically connected to the second conductive contact 7432 through the conductive via 744 and the second plurality of wirings 7431.

According to one embodiment, the PCB 750 may further include a third conductive contact 752. The third conductive contact 752 may be disposed in a position corresponding to the second conductive contact 7432. In addition, the PCB 750 may mount a variety of electronic components 753 on the PCB 750. The PCB 750 may be separated by a specific interval from the pressure sensor 740 so that there is sufficient space to mount the variety of the electronic components 753.

The PCB 750 may be electrically connected to various constitutional elements including the display 730 and the pressure sensor 740. For example, the first conductive contact 751 may be connected to the end portion 7341 of the FPCB 734. Therefore, the PCB 750 may be electrically connected to the display 730 through the first plurality of wirings 7342 on the FPCB 734. In addition, the second conductive contact 7432 on the support member 743 may be electrically connected to the third conductive contact 752. In this case, since the support member 743 and the PCB 750 are separated by a certain distance, the second conductive contact 7432 and the third conductive contact 752 may be connected to each other using a conductive construction 760 between the two contacts. The conductive construction 760 may include, for example, a C-clip, a Fogo-pin, a bonding pad, or the like.

Therefore, the pressure sensor 740 may be electrically connected to the PCB 750 through conductive connection members (the second conductive contact 7432, the third conductive contact 752, and the conductive construction 760) in an area that at least partially overlaps with the third AA 7401 when viewing the electronic device 700 from the top, i.e. in the −Z direction as shown in FIG. 7A. As shown in the figures, the pressure sensor 740 may be electrically connected to the PCB 750 through the conductive connection members that penetrate the support member 743.

Figure 8:
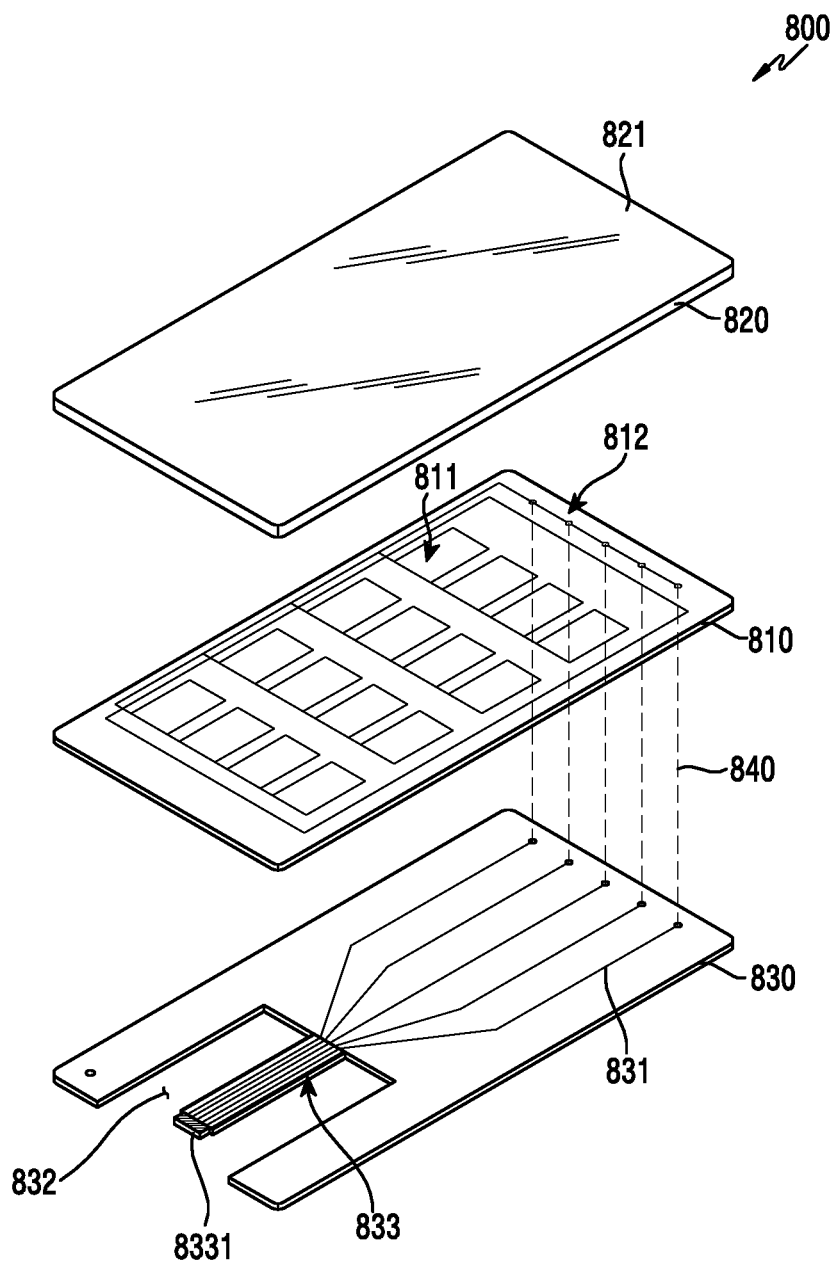
FIG. 8 is an exploded perspective view of a pressure sensor according to one embodiment of the present disclosure.

FIG. 8 is an exploded perspective view of a pressure sensor according to one embodiment.

Referring to FIG. 8, a pressure sensor 800 according to one embodiment may include a first electrode layer 810, a second electrode layer 820, a support member 830, a plurality of wirings 831, a first conductive via 840, etc. Meanwhile, detailed descriptions on structures identical or similar to the structures described in FIG. 7 will be omitted.

According to one embodiment, the support member 830 may include an opening 832 and an FPCB 833 in at least one part thereof. The FPCB 833 may be extended towards the opening 832. For example, the FPCB 833 may be a protrusion extending from one side of the opening 832. Alternatively, it may be attached to a lateral surface of the opening 832. Alternatively, the support member 830 may be manufactured as one PCB, and may include the opening 832 and an FPCB 833 extending into the opening 832. For another example, the FPCB 833 may be manufactured by processing the FPCB 833 when cutting a base layer for the support member 830 or when processing the outer shape of the opening 832. That is, the pressure sensor 800 may be manufactured through multi-layer processing in which each of the first electrode layer 810, the second electrode layer 820, and the support member 830 is laminated after being subjected to outer shape processing. Details thereof will be described below FIG. 16.

The plurality of wirings 831 of the support member 830 may be connected to an end portion 8331 of the FPCB 833. Portions of the plurality of wirings 831 may be disposed on the FPCB 833. Therefore, the first electrode layer 810 may be electrically connected to the end portion 8331 of the FPCB 833 through the conductive via 840 and the plurality of wirings 831.

According to one embodiment, the end portion 8331 of the FPCB 833 may be disposed to at least partially overlap with an AA 811 when viewing the pressure sensor 800 from the top, i.e. in the −Z direction.

Figure 9A:
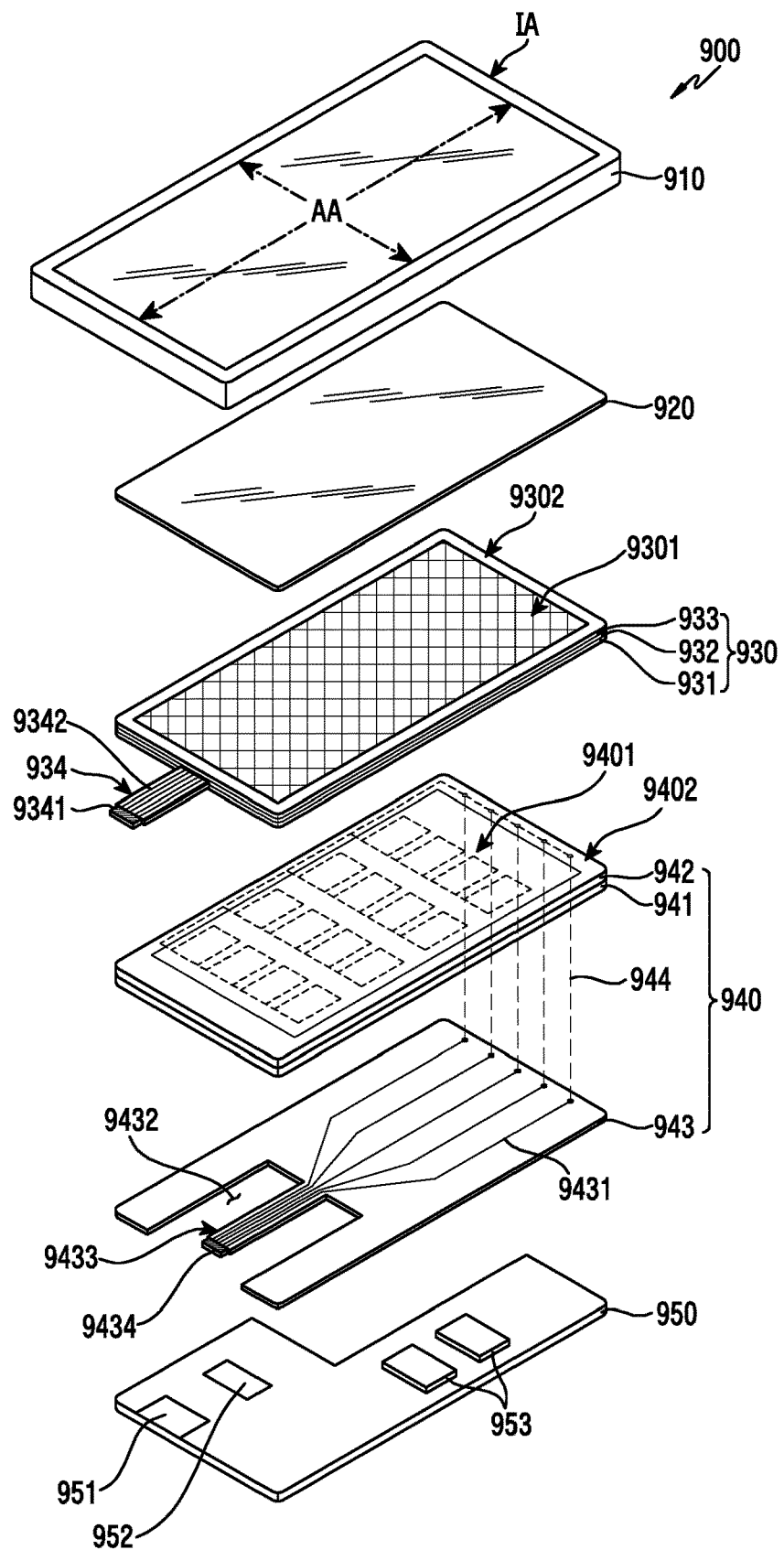
FIG. 9A is an exploded perspective view of an electronic device according to one embodiment of the present disclosure.
Figure 9B:
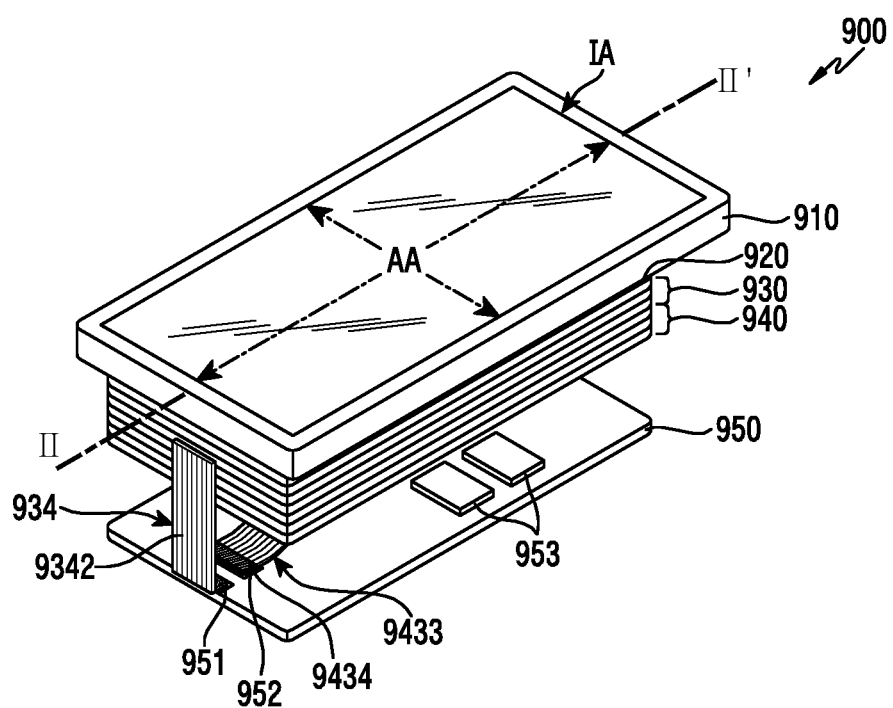
FIG. 9B is an assembled perspective view of an electronic device according to one embodiment of the present disclosure.
Figure 9C:
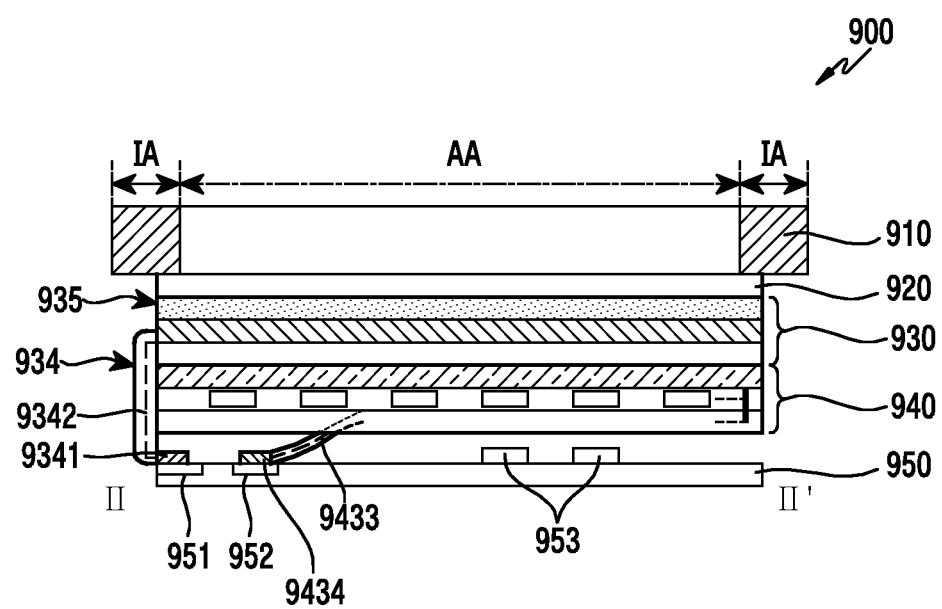
FIG. 9C illustrates a cross-sectional view cut along the line II-II' of FIG. 9A and FIG. 9B according to one embodiment of the present disclosure.

FIG. 9A is an exploded perspective view of an electronic device according to one embodiment of the present disclosure. FIG. 9B is an assembled perspective view of an electronic device according to one embodiment of the present disclosure. FIG. 9C illustrates a cross-sectional view cut along the line II-II' of FIG. 9A and FIG. 9B according to one embodiment of the present disclosure.

Referring to FIG. 9A to FIG. 9C, an electronic device 900 according to one embodiment may include a transparent cover 910, a polarizing layer 920, a display 930, a pressure sensor 940, a PCB 950, etc. Meanwhile, detailed descriptions on structures identical or similar to the structures described in FIG. 7A to FIG. 7C will be omitted.

The display 930 may include a first FPCB 934 extended from a lateral surface of the first IA 9302. The first FPCB 934 may be coupled to a first display layer 931 or a second display layer 932 when they are separately manufactured, or may be integrally manufactured with the first display layer 931 or the second display layer 932. A first plurality of wirings 9342 may be disposed on the first FPCB 934. The first plurality of wirings 9342 may electrically connect the circuits of the first display layer 931, second display layer 932, and touch screen layer 933, each of which are disposed on the first IA 9302 to the first end portion 9341 of the first FPCB 934. Referring to FIG. 9B and FIG. 9C, the first FPCB 934 may be folded along the lateral surface 935 of the pressure sensor 940 and the display 930. Meanwhile, the end portion 9341 of the folded first FPCB 934 may be connected to the first conductive contact 951 included in the PCB 950. Therefore, the display 930 may be electrically connected to the PCB 950 through the first plurality of wirings 9342 on the first FPCB 934.

According to one embodiment, the pressure sensor 940 may include a support member 943 including a first electrode layer 941, a second electrode layer 942, and a second plurality of wirings 9431. Meanwhile, the pressure sensor 940 of FIG. 9A to FIG. 9C may be a device similar or identical to the pressure sensor 800 of FIG. 8.

According to one embodiment, the support member 943 may include an opening 9432 and a second FPCB 9433 in at least one part thereof. The second FPCB 9433 may be a protrusion extended from one side of the opening 9432. The second plurality of wirings 9431 of the support member 943 may be connected to a second end portion 9434 of the second FPCB 9433. Portions of the second plurality of wirings 9431 may be disposed on the FPCB 9433. Therefore, the first electrode layer 941 may be electrically connected to the second end portion 9434 of the second FPCB 9433 through a conductive via 944 and the second plurality of wirings 9431.

According to one embodiment, the PCB 950 may further include a second conductive contact 952. The second conductive contact 952 may be disposed on the PCB 950 within the AA 9401. In addition, the PCB 950 may mount a variety of electronic components 953 on the PCB 950. The PCB 950 may be separated by a specific interval from the pressure sensor 940 so that there is sufficient space to mount the variety of the electronic components 953.

The PCB 950 may be electrically connected to various constitutional elements including the display 930 and the pressure sensor 940. For example, the first conductive contact 951 may be connected to the first end portion 9341 of the first FPCB 934. Therefore, the PCB 950 may be electrically connected to the display 930 through the first plurality of wirings 9342 on the first FPCB 934. In addition, the second conductive contact 952 may be electrically connected to the second FPCB 9433. In this case, since the support member 943 and the PCB 950 are separated by a certain distance, the second FPCB 9433 may be bent or deflected to electrically connect the second end portion 9434 to the second conductive contact 952, as shown in FIG. 9C.

Therefore, the pressure sensor 940 may be electrically connected to the PCB 950 through conductive connection members (the second conductive contact 952 and the second end portion 9434 of the second FPCB 9433) in an area that at least partially overlaps with the AA 9401 when viewing the electronic device 700 from the top, i.e. in the −Z direction. Stated differently, the pressure sensor 940 may be electrically connected to the PCB 950 through the conductive connection members disposed to penetrate the support member 943 (the conductive via 944 and the second FPCB 9322 are connected through the conductive connection members between them.

Figure 10A:
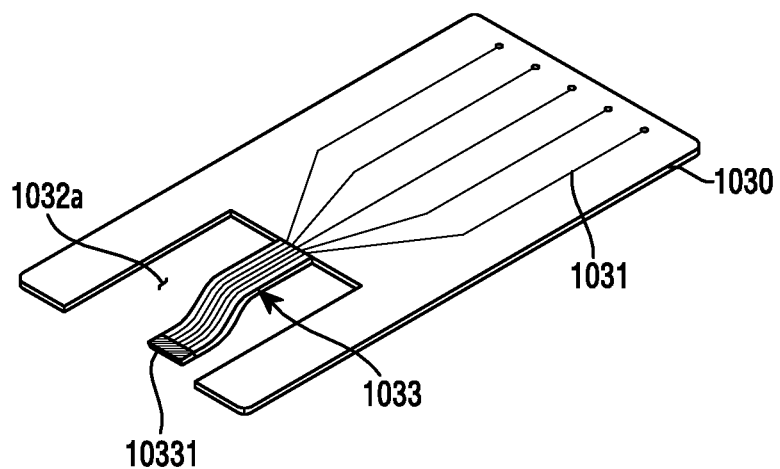
FIG. 10A is a perspective view of a support member of a pressure sensor according to one embodiment of the present disclosure.
Figure 10B:
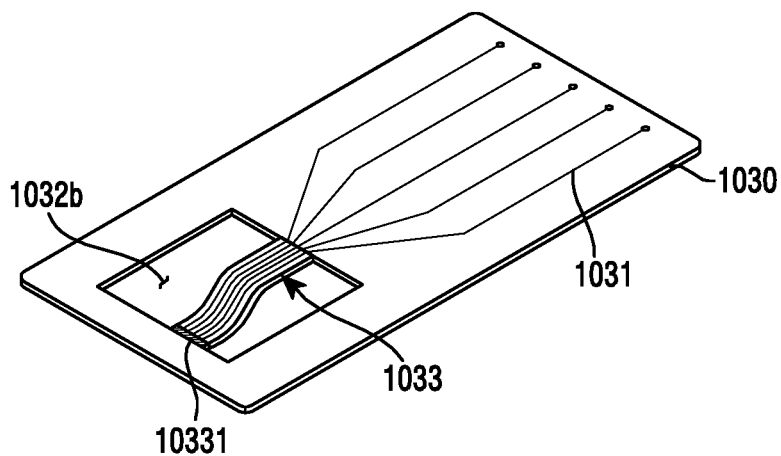
FIG. 10B is a perspective view of a support member of a pressure sensor according to other embodiment of the present disclosure.

FIG. 10A is a perspective view of a support member of a pressure sensor according to one embodiment of the present disclosure. FIG. 10B is a perspective view of a support member of a pressure sensor according to other embodiment of the present disclosure. The support member 1030 may be a device similar or identical to the support member 943 of the pressure sensor 940 of FIG. 9A to FIG. 9C.

Referring to FIG. 10A to FIG. 10B, the support member 1030 of the pressure sensor according to one embodiment may include a plurality of wirings 1031, an opening 1032, and an FPCB 1033 formed as a protrusion extended from one side of the opening 1032. As shown in FIG. 10A, an opening 1032a may be formed in such a manner that one portion of the support member 1030 is open. Alternatively, as shown in FIG. 10B, an opening 1032b may be formed in such a manner that one portion of the support member 1030 is closed.

Generally, in pressure sensors that do not have the opening 1032, the FPCB 1033 may protrude from the pressure sensor. This protrusion may cause problems when mounting the pressure sensor in electronic devices. When the support member 1030 has the opening 1032 however, this protrusion problem can be avoided.

Figure 11:
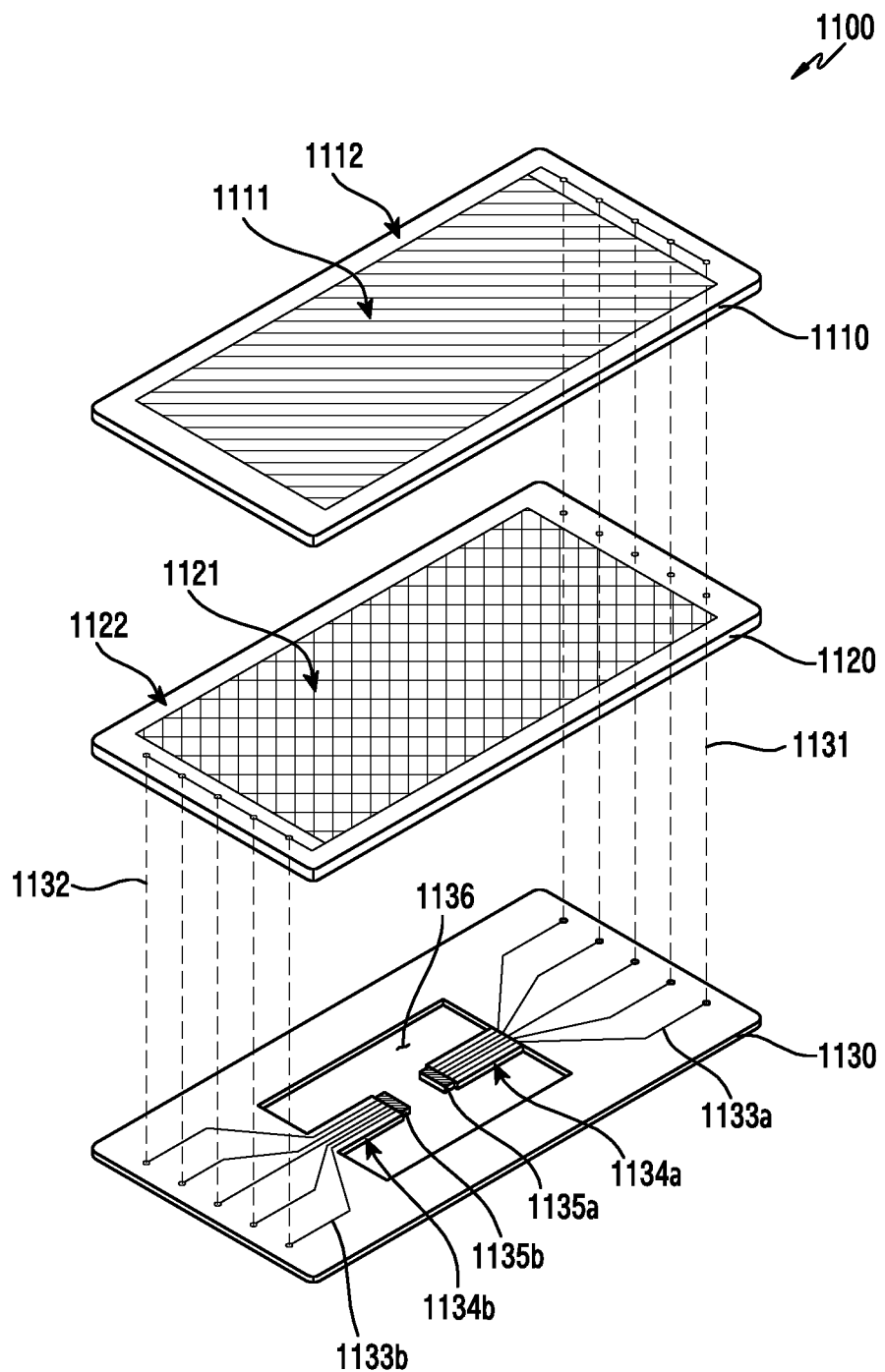
FIG. 11 is an exploded perspective view of an electronic device according to one embodiment of the present disclosure.

FIG. 11 is an exploded perspective view of an electronic device according to one embodiment of the present disclosure.

Referring to FIG. 11, an electronic device 1100 according to one embodiment of the present disclosure may include a multi-sensor structure 1110, a display 1120, and a support member 1130. The multi-sensor structure 1110, the display 1120, and the support member 1130 may be disposed sequentially along the second direction (−Z). That is, the display 1120 may be disposed between the multi-sensor structure 1110 and the support member 1130. However, the embodiment is not limited thereto, and the multi-sensor structure 1110, the display 1120, and the support member 1130 may be disposed in various orders.

The multi-sensor structure 1110 may include a first AA 1111 where various inputs can be detected. For example, the multi-sensor structure 1110 may include at least two of a pressure sensor capable of sensing pressure of an external object on the first AA 1111, a touch sensor capable of sensing a touch position of the external object, a fingerprint sensor capable of recognizing a user's fingerprint, and a digitizer capable of sensing an input of a stylus pen, etc. To accomplish this, the multi-sensor structure 1110 may include various multi-sensor components, e.g., a first conductive electrode, a second conductive electrode, or the like, on the first AA 1111. In addition, various sensors in the multi-sensor structure 1110 may share one electrode, in order to minimize the mounting space required by the multi-sensor. Meanwhile, the multi-sensor structure 1110 may be transparent to expose the display 1120. In addition, the multi-sensor structure 1110 may include a first IA 1112 disposed around the first AA 1111. The first IA 1112 of the multi-sensor structure 1110 may be where circuits such as signal wiring are disposed.

The display 1120 may include, for example, a Liquid Crystal Display (LCD) display, a Light Emitting Diode (LED) display, an Organic Light-Emitting Diode (OLED) display, a MicroElectroMechanical Systems (MEMS) display, or an electronic paper display.

The display 1120 may include a second AA 1121 for displaying information to a user. For this, the display 1120 may include various touch screen display components (e.g., OLED components, an OLED, light generating components, image generating components, etc.) on the second AA 1121. In addition, the second AA 1121 may correspond to the first AA 1111 of the multi-sensor structure 1110. Meanwhile, the display 1120 may include a second IA 1122 disposed around the second AA 1121. The second IA 1122 of the display 1120 may be where circuits such as signal wiring are disposed.

The support member 1130 may include a first plurality of wirings 1133a electrically connected to the multi-sensor structure 1110 and a second plurality of wirings 1133b electrically connected to the display 1120. For example, a signal wiring circuit of the multi-sensor structure 1110 may connect the multi-sensor structure 1110 and the display 1120 with the first plurality of wirings 1133a through a first conductive via 1131 which penetrates the display 1120. In addition, the signal wiring circuit of the display 1120 may be electrically connected to the first plurality of wirings 1133a through a second conductive via 1132 which penetrates the display 1120. Meanwhile, the first conductive via 1131 and the second conductive via 1132 may be disposed in the IA of the multi-sensor structure 1110 and the display 1120 as signal wirings.

The support member 1130 may include an opening 1136. In addition, the support member 1130 may further include a first FPCB 1134a and a second FPCB 1134b. For example, the first FPCB 1134a and the second FPCB 1134b may be formed as protrusions extended from two opposite sides of the opening 1136. Alternatively, the support member 1130 may be manufactured as separate portions which are then coupled together. As another example, the opening 1136, the first FPCB 1134a, and the second FPCB 1134b may be manufactured by processing them together when the outer shape of the support member 1130 is processed. That is, constitutional elements including the support member 1130 of the electronic device 1100 may be manufactured through multi-layer processing in which each of the elements is laminated after being subjected to outer shape processing. Therefore, the multi-sensor structure 1110, the display 1120, the support member 1130, or the like may be manufactured as one module. In addition, a transparent cover may be placed on top of the multi-sensor structure 1110.

The first plurality of wirings 1133a may be connected to a first end portion 1135a along the first FPCB 1134a. In addition, the second plurality of wirings 1133b may be connected to a second end portion 1135b along the second FPCB 1134b. Meanwhile, the first FPCB 1134a and the second FPCB 1134b may be bent or deflected so that each of the first end portion 1135a and the second end portion 1135b is coupled to the PCB. Therefore, each of the multi-sensor structure 1110 and the display 1120 may be electrically connected to the PCB through the first FPCB 1134a and second FPCB 1134b included in the support member 1130.

Figure 12A:
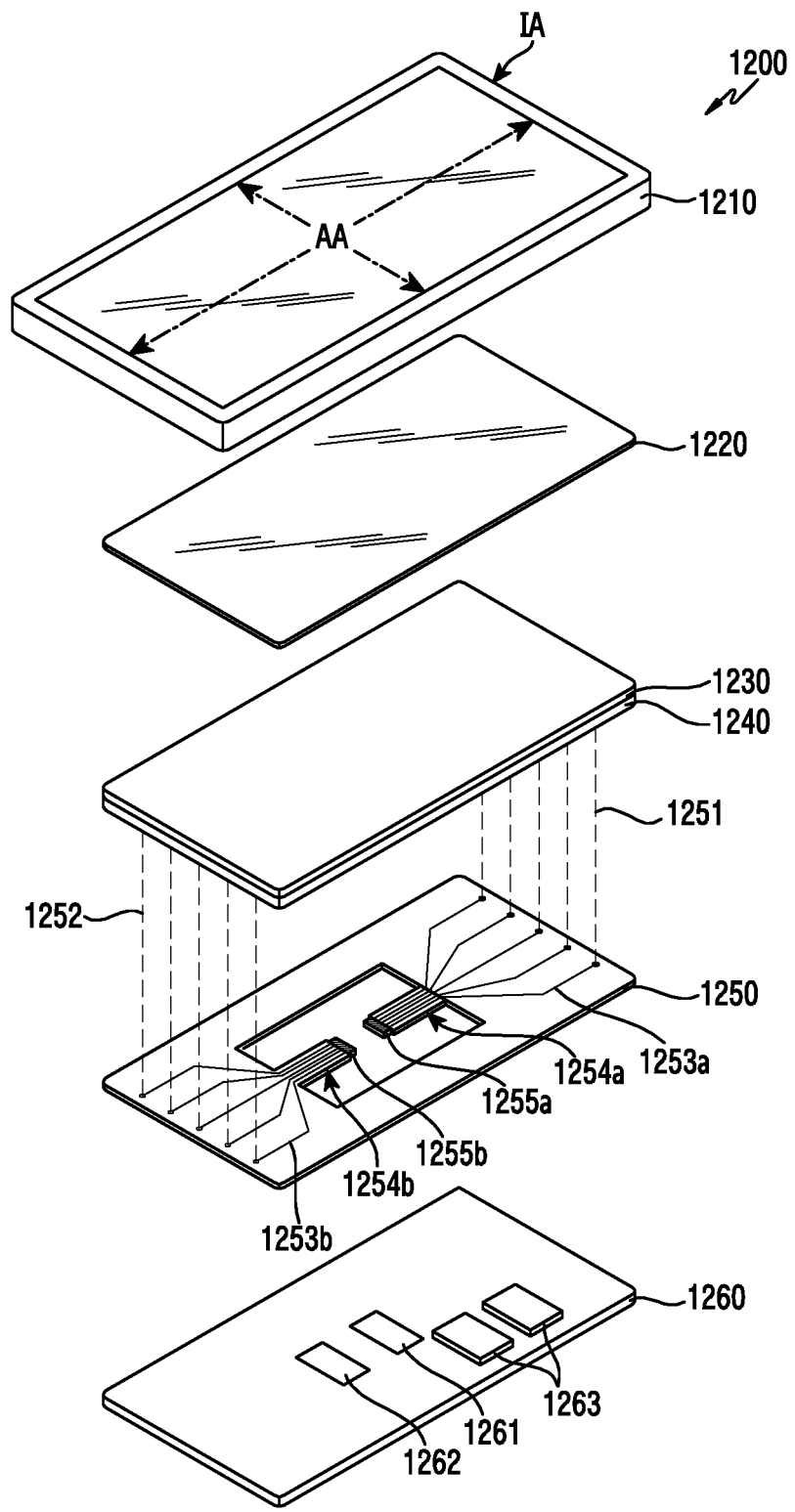
FIG. 12A is an exploded perspective view of an electronic device according to one embodiment of the present disclosure.
Figure 12B:
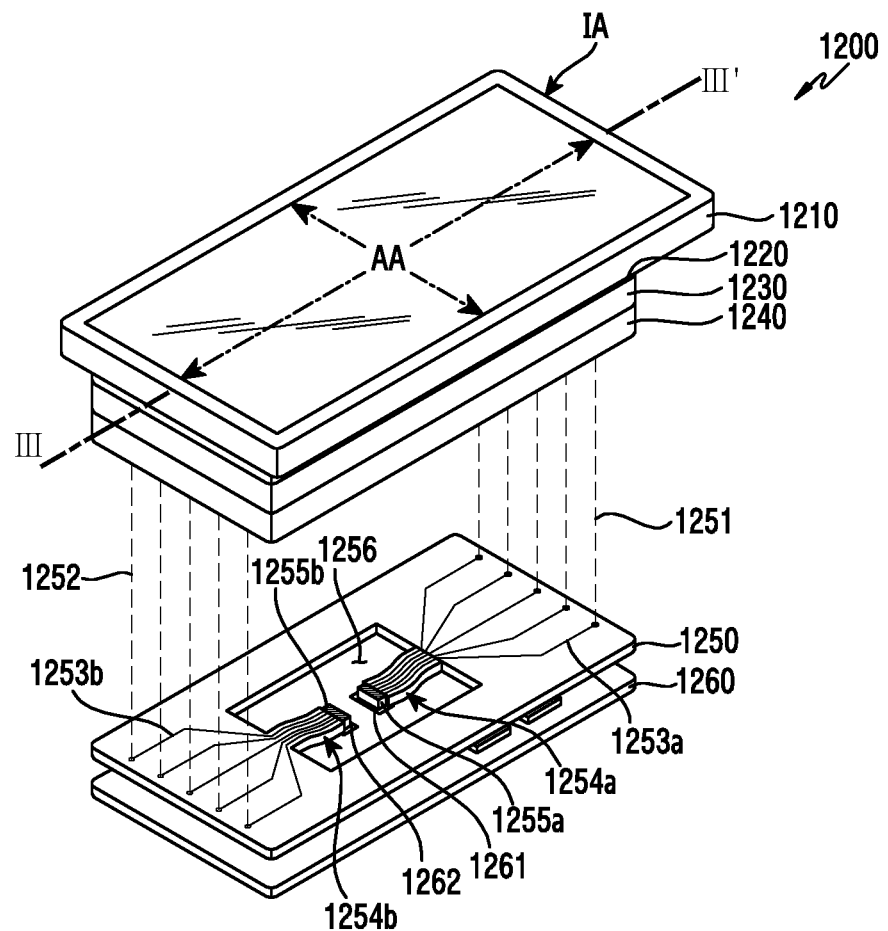
FIG. 12B is an assembled perspective view of an electronic device according to one embodiment of the present disclosure.
Figure 12C:
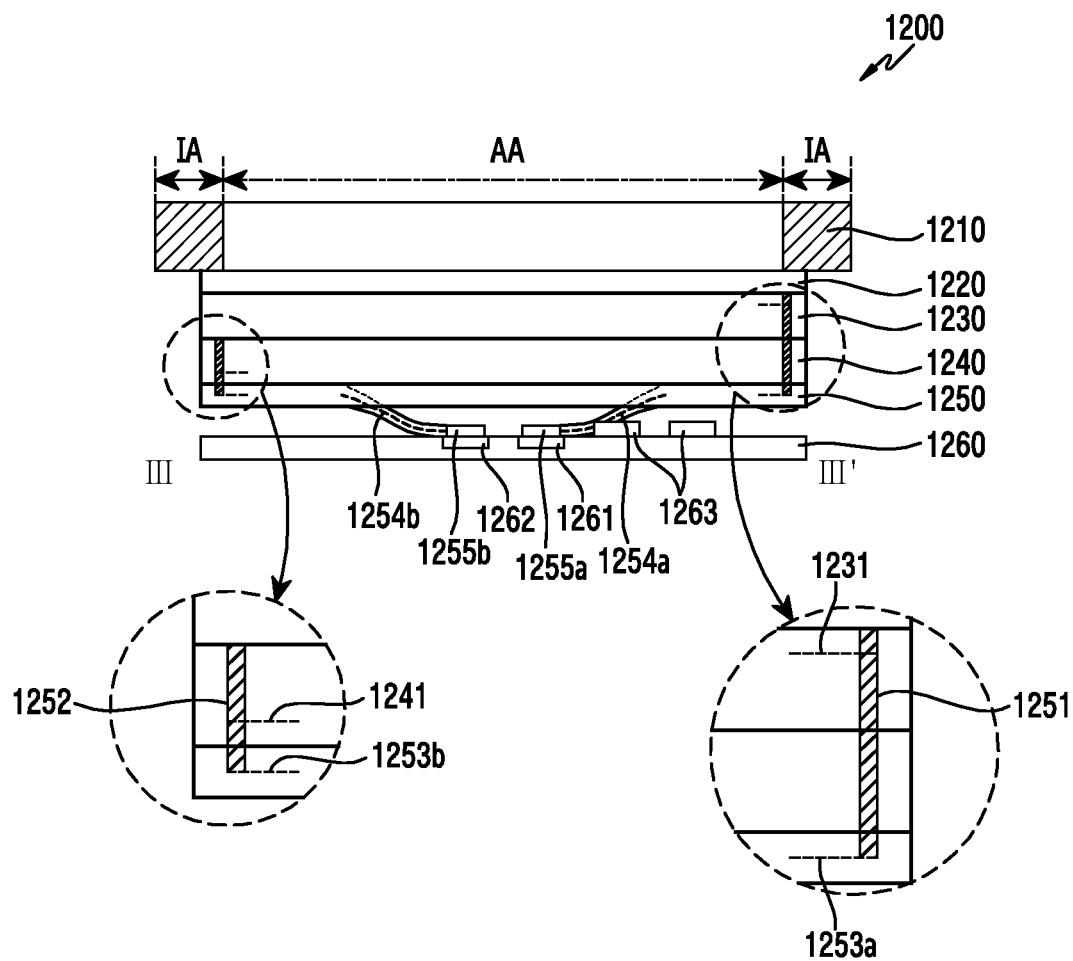
FIG. 12C illustrates a cross-sectional view cut along the line III-III' of FIG. 12A and FIG. 12B according to one embodiment of the present disclosure.

FIG. 12A is an exploded perspective view of an electronic device according to one embodiment of the present disclosure. FIG. 12B is an assembled perspective view of an electronic device according to one embodiment of the present disclosure. FIG. 12C illustrates a cross-sectional view cut along the line III-III' of FIG. 12A and FIG. 12B according to one embodiment of the present disclosure.

Referring to FIG. 12A to FIG. 12C, an electronic device 1200 may include a transparent cover 1210, a polarizing layer 1220, a multi-sensor structure 1230, a display 1240, a support member 1250, a PCB 1260, etc. The transparent cover 1210, the polarizing layer 1220, the multi-sensor structure 1230, the display 1240, the support member 1250, the PCB 1260, or the like may be sequentially disposed along the second direction (−Z).

The multi-sensor structure 1230, the display 1240, and the support member 1250 may be identical or similar to the electronic device module of FIG. 11. Accordingly, detailed descriptions on structures identical or similar to the structures described in FIG. 11 will be omitted.

According to one embodiment, the PCB 1260 may include a first plurality of wirings 1253a and a second plurality of wirings 1253b. The first plurality of wirings 1253a may be electrically connected to signal wirings 1231 on the multi-sensor structure 1230 through a first conductive via 1251 which penetrates at least one part of the display 1240. In addition, the second plurality of wirings 1253b may be electrically connected to signal wirings 1241 on the display 1240 through a second conductive via 1252 which penetrates at least one part of the display 1240. The support member 1250 may further include a first FPCB 1254a and a second FPCB 1254b. Each of the first FPCB 1254a and the second FPCB 1254b may be a protrusion extended from one side of an opening 1256. The first plurality of wirings 1253a of the support member 1250 may be connected to the first end portion 1255a of the first FPCB 1254a. For example, portions of the first plurality of wirings 1253a may be disposed on the first FPCB 1254a. In addition, the second plurality of wirings 1253b of the support member 1250 may be connected to the second end portion 1255b of the second FPCB 1254b. Portions of the second plurality of wirings 1253b may be disposed on the second FPCB 1254b. Therefore, the multi-sensor structure 1230 may be electrically connected to the first end portion 1255a of the first FPCB 1254a through the first conductive via 1251 and the first plurality of wirings 1253a. In addition, the display 1240 may be electrically connected to the second end portion 1255b of the second FPCB 1254b through the second conductive via 1252 and the second plurality of wirings 1253b.

The PCB 1260 may include a first conductive contact 1261 and a second conductive contact 1262. The first conductive contact 1261 and the second conductive contact 1262 may be disposed on the PCB 1260 within the AA. The first conductive contact 1261 and the second conductive contact 1262 may be disposed on the PCB 1260 so they face each other. In addition, a variety of electronic components 1263 may be mounted on the PCB 1260. The PCB 1260 may be separated by a specific interval from the support member 1250 so that there is sufficient space to mount the variety of electronic components 1263.

The PCB 1260 may be electrically connected to various constitutional elements including the multi-sensor structure 1230 and the display 1240. For example, the first conductive contact 1261 may be connected to the first end portion 1255a of the first FPCB 1254a. The second conductive contact 1262 may be connected to the second end portion 1255b of the second FPCB 1254b. Therefore, the PCB 1260 may be electrically connected to the multi-sensor structure 1230 through the first plurality of wirings 1253a on the first FPCB 1254a. In addition, the PCB 1260 may be electrically connected to the display 1240 through the second plurality of wirings 1253b on the second FPCB 1254b. In this case, since the support member 1250 is on top of the PCB 1260, each of the first FPCB 1254a and the second FPCB 1254b may be bent or deflected, as shown in FIG. 12C, so that an end portion thereof is electrically connected to the PCB 1260.

Therefore, the multi-sensor structure 1230 and the display 1240 may be electrically connected to the PCB 1260 through a conductive connection member (e.g., the first FPCB 1254a, the second FPCB 1254b, the first conductive contact 1261, and the second conductive contact 1262) such that the connection is placed within or overlapping the AA.

Figure 13A:
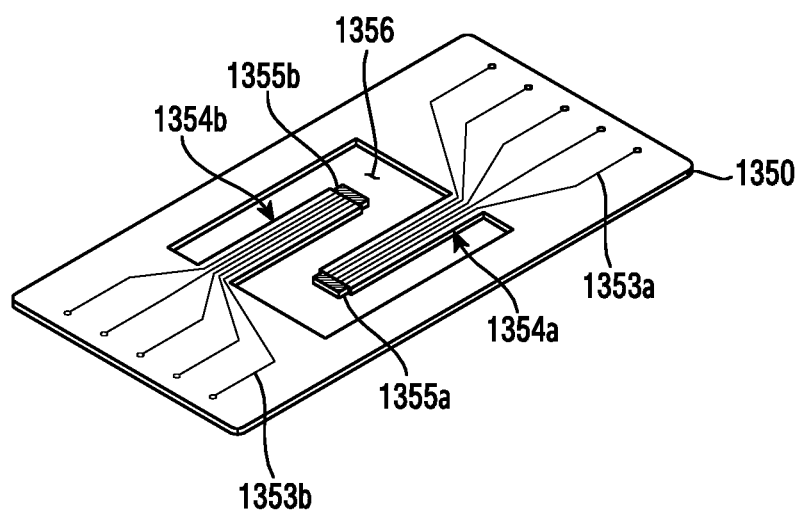
FIG. 13A is a perspective view of a support member according to one embodiment of the present disclosure.
Figure 13B:
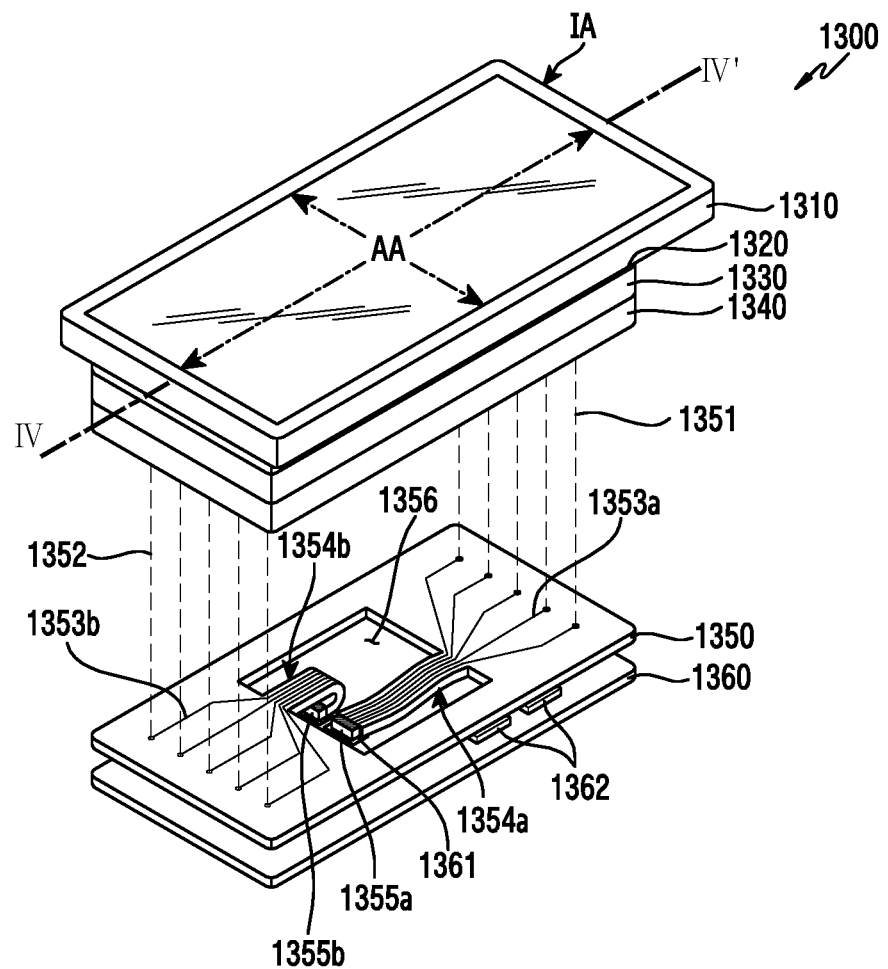
FIG. 13B is an exploded perspective view of an electronic device to which the support member of FIG. 13A is applied according to one embodiment of the present disclosure.

FIG. 13A is a perspective view of a support member according to one embodiments of the present disclosure. FIG. 13B is an exploded perspective view of an electronic device to which the support member of FIG. 13A is applied. In addition, FIG. 13C illustrates a cross-sectional view cut along the line IV-IV' of FIG. 13A and FIG. 13B according to one embodiment of the present disclosure.

Figure 13C:
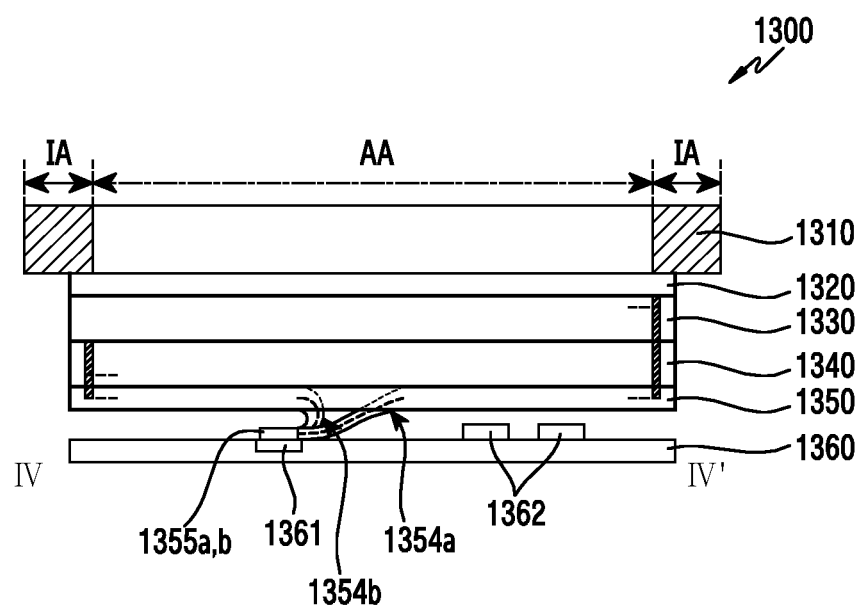
FIG. 13C illustrates a cross-sectional view cut along the line IV-IV' of FIG. 13A and FIG. 13B according to one embodiment of the present disclosure.

The embodiment disclosed in FIG. 13A to FIG. 13C may have structures identical or similar to that of the embodiment disclosed in FIG. 12A to FIG. 12C, with the exception of the support member 1350. Therefore, detailed descriptions on structures identical or similar to the structures described in FIG. 12A to FIG. 12C will be omitted. Referring to FIG. 13A, the first FPCB 1354a and second FPCB 1354b according to one embodiment of the present disclosure may be disposed to be parallel to each other on the support member 1350.

Referring to FIG. 13B and FIG. 13C, a first end portion 1355a and a second end portion 1355b may be connected to the conductive contact 1361. For example, the second FPCB 1354b may be connected to the conductive contact 1361 of the PCB 1360 by being folded 180 degrees. As another example, unlike what is shown, the first FPCB 1354a may be connected to the conductive contact 1361 of the PCB 1360 by being folded 180 degrees. That is, the first FPCB 1354a and the second FPCB 1354b may be connected to the PCB 1360 at various positions.

Therefore, a multi-sensor structure 1330 and a display 1340 may be electrically connected to the PCB 1360 through a conductive connection member (e.g., the first FPCB 1354a, the second FPCB 1354b, the conductive contact 1361) such that the connection is placed within or overlapping the AA.

Figure 14:
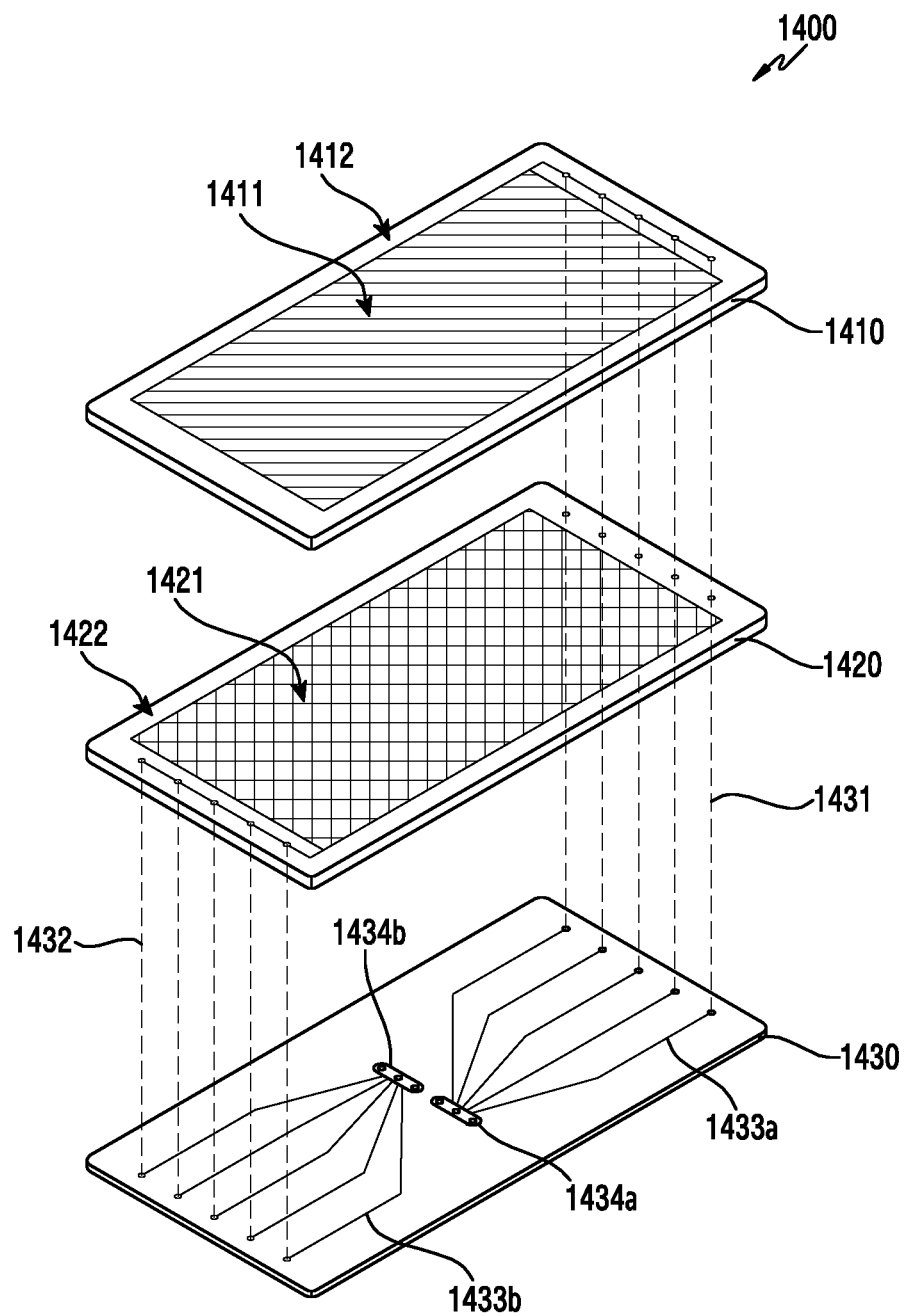
FIG. 14 is an exploded perspective view of an electronic device according to one embodiment of the present disclosure.

FIG. 14 is an exploded perspective view of an electronic device according to one embodiment of the present disclosure.

The embodiment disclosed in FIG. 14 may have identical or similar structures in comparison with the embodiment disclosed in FIG. 12A to FIG. 12C, with the exception of the support member 1430. Therefore, detailed descriptions on the identical or similar structures will be omitted.

The support member 1430 may include a first plurality of wirings 1433a, a second plurality of wirings 1433b, a first conductive contact 1434a, and a second conductive contact 1434b. The first plurality of wirings 1433a may be connected to the first conductive contact 1434a, and the second plurality of wirings 1433b may be connected to the second conductive contact 1434b. The first conductive contact 1434a and the second conductive contact 1434b may be disposed on the support member 1430 within the AA.

Figure 15A:
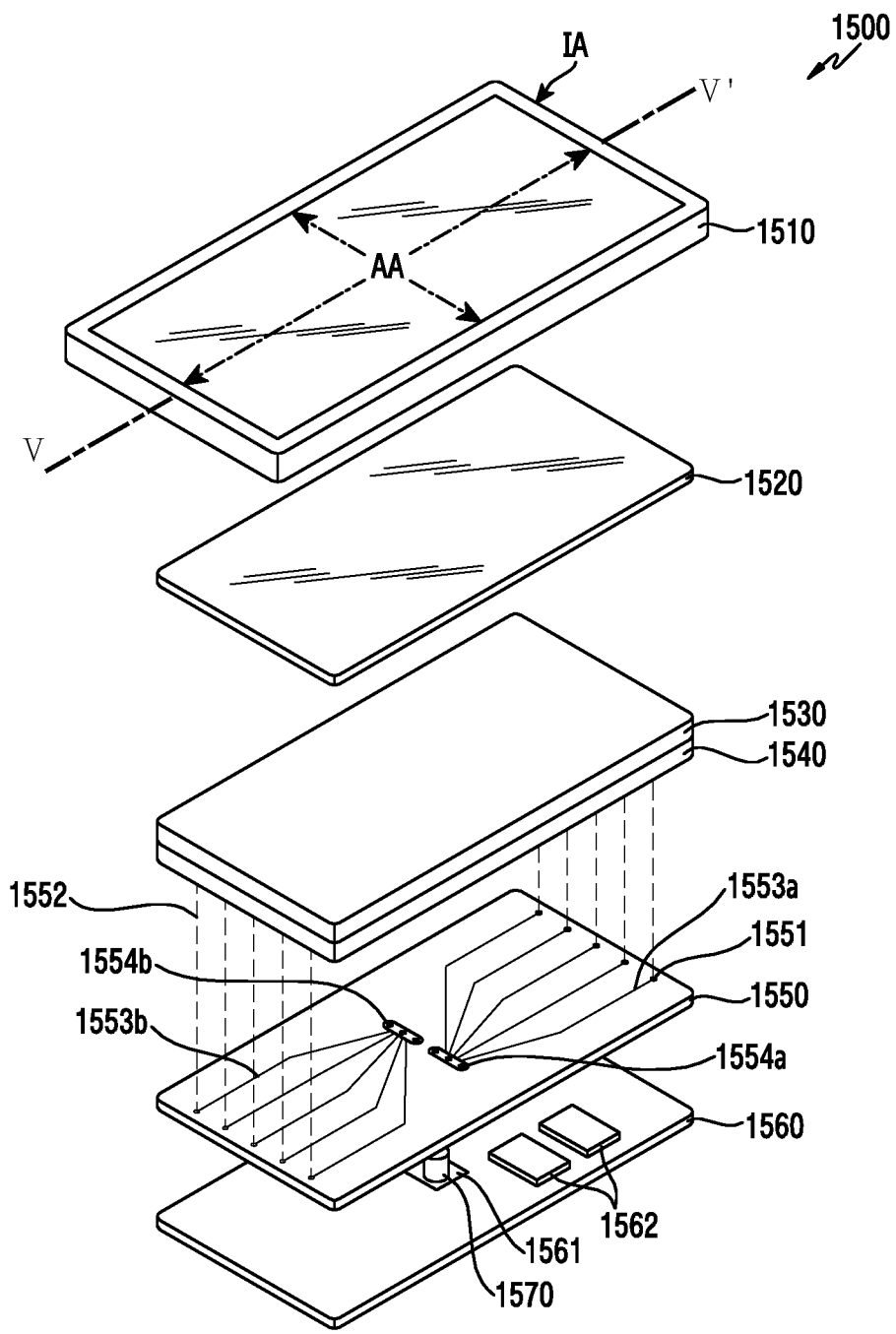
FIG. 15A is an exploded perspective view of an electronic device according to one embodiment of the present disclosure.
Figure 15B:
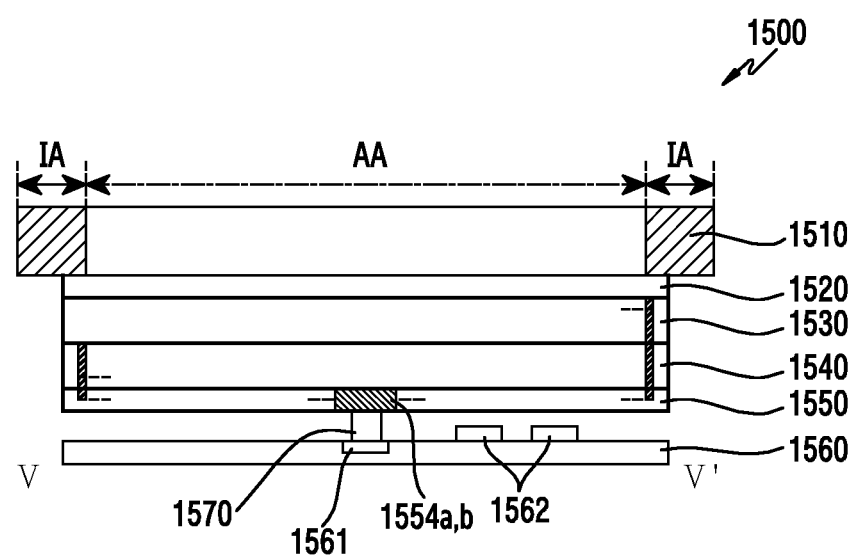
FIG. 15B illustrates a cross-sectional view cut along the line V-V' of FIG. 15A according to one embodiment of the present disclosure.

FIG. 15A is an exploded perspective view of an electronic device according to one embodiment of the present disclosure. FIG. 15B illustrates a cross-sectional view cut along the line V-V' of FIG. 15A according to one embodiment of the present disclosure.

Referring to FIG. 15A to FIG. 15B, an electronic device 1500 may include a transparent cover 1510, a polarizing layer 1520, a multi-sensor structure 1530, a display 1540, a support member 1550, and a PCB 1560 sequentially along a second direction (−Z). Constitutional elements disclosed in FIG. 15A and FIG. 15B may have structures identical or similar to that of constitutional elements disclosed in FIG. 13A to FIG. 13C, with the exception of the support member 1550. Accordingly, detailed descriptions on the same or similar structures will be omitted.

The PCB 1560 may include a third conductive contact 1561 and a variety of electronic components 1562. The PCB 1560 may be separated from the support member 1550 by a specific interval so that there is enough space to mount the variety of electronic components 1562. The third conductive contact 1561 may be connected to the first conductive contact 1554a and the second conductive contact 1555b on the support member 1550. For this, the third conductive contact 1561 may be disposed at a position corresponding to the first conductive contact 1554a and/or the second conductive contact 1554b. Meanwhile, since the PCB 1560 and the support member 1550 are separated by a specific interval therebetween, the conductive construction 1570 may be disposed between the PCB 1560 and the support member 1550 to connect the first conductive contact 1554a and the second conductive contact 1554b to at least one third conductive contact 1561. For example, the conductive construction 1570 may include a C-clip, a Fogo-pin, a bonding pad, or the like.

Therefore, the multi-sensor structure 1530 and the display 1540 may be electrically connected to the PCB 1560 through conductive connection members (e.g., the first conductive contact 1554a, the second conductive contact 1554b, and the conductive construction 1570) such that the connection is placed within or overlapping the AA As shown in the figures, the multi-sensor structure 1530 and the display 1540 may be electrically connected to the PCB 1560 through conductive connection members that penetrate the support member 1550.

Figure 16:
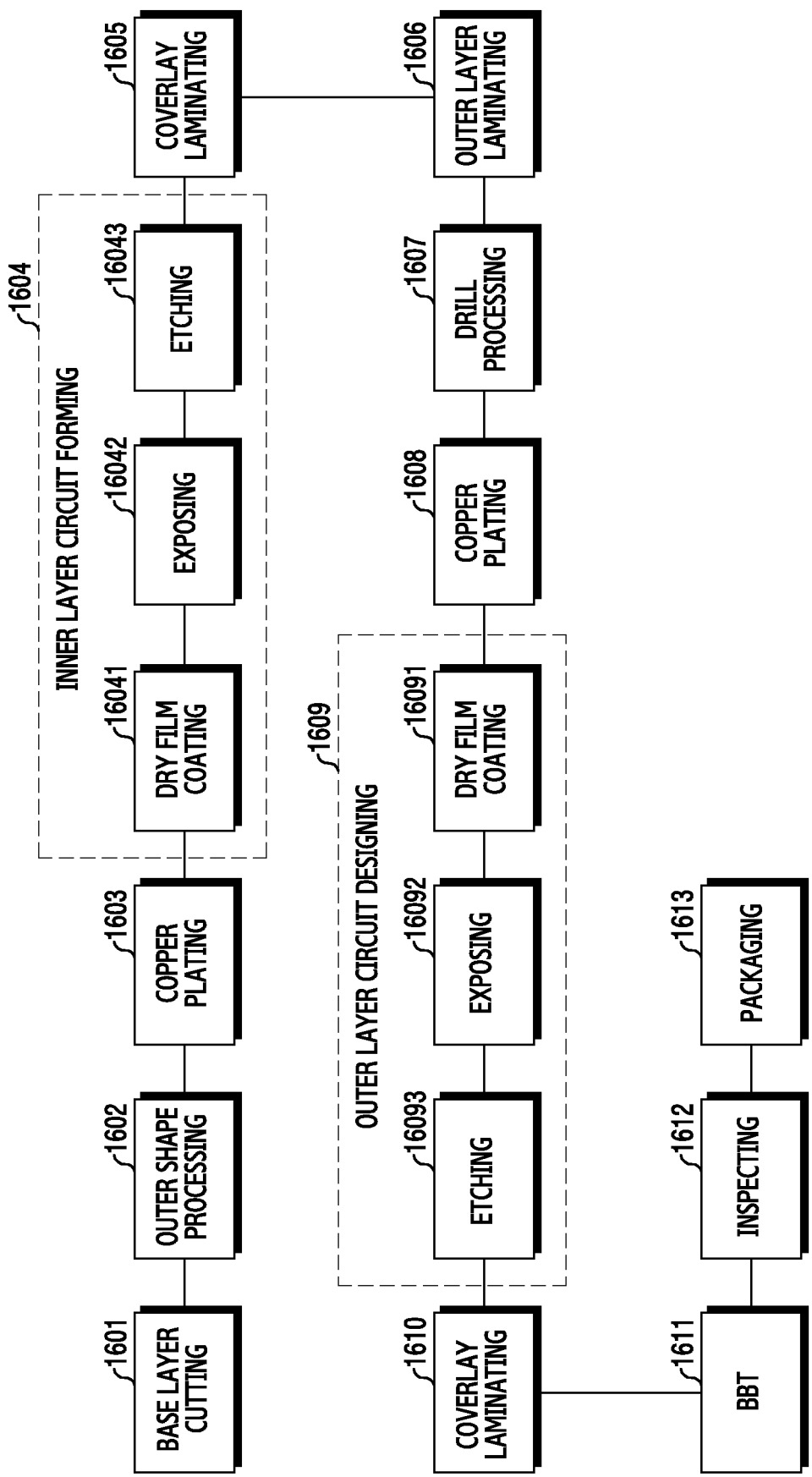
FIG. 16 is a process flowchart of an electronic device according to one embodiment of the present disclosure.

FIG. 16 is a process flowchart of an electronic device according to one embodiment of the present disclosure.

Referring to FIG. 16, base layer cutting 1601 may include a process of cutting a base layer as required by the size of the electronic device. The base layer may include, for example, any one or combinations of acrylic, PolyCarbonate (PC), PolyMethyl MethAcrylate (PMMA), PolyImide (PI), PolyEthylene Terephthalate (PET), PolyPropylene Terephthalate (PPT), Amorphous PolyEthylene Terephthalate (APET), Polyethylene Naphthalate Terephthalate (PNT), PolyEthylene Terephthalate Glycol (PETG), Tri-Acetyl-Cellulose (TAC), Cyclic Olefin Polymer (COP), Cyclic Olefin Copolymer (COC), poly-DicyCloPentaDiene (DCPD), CycloPentDienyl anions (CPD), PolyARylate (PAR), PolyEtherSulfone (PES), Poly Ether Imide (PEI), modified epoxy resin, acrylic resin, etc.

As a procedure of processing the outer shape to create the final size and shape of the product, outer shape processing 1602 may be achieved in general after final coverlay laminating 1610. However, the pressure sensor or the multi-sensor structure according to various embodiments of the present disclosure has a shape that includes an opening and one or more protrusions extended from one side of the opening. To form this shape, the outer shape processing 1602 may be first achieved before circuit forming 1604 or coverlay laminating 1605. Therefore, processes such as circuit forming or the like may be achieved after the shape of the support member (including an opening) is manufactured through the outer shape processing 1602.

Copper plating 1603 may be achieved after finishing the base layer cutting 1601 and/or the outer shape processing 1602. The copper plating 1603 may be a process where conductivity for the base layer is provided by plating conductive copper to the base layer.

Inner layer circuit forming 1604 may include dry film coating 16041, exposing 16042, and etching 16043.

The dry film coating 16041 may be a process where a dry film is laminated to the copper-plated base layer by using heat and pressure. The dry film has a characteristic of being hardened with light energy (e.g., ultraviolet light). As pre-processing before coating, oxide film, fingerprint, or the like may be remove from the surface of the copper-plated base layer so that the dry film can be adhered easily. The surface of the base layer may also be scrubbed to roughen the surface, also so that the dry film can adhere more easily.

The exposing 16042 may be where coated dry film is hardened as an inner layer circuit pattern by providing ultraviolet light to the dry film. The dry film may be masked so that after the exposing 16042, a developing process peels off portions of the dry film that are not hardened because they were not exposed to the light due to the masking.

The etching 16043 may be a process where copper is removed by spraying etching liquid to the plated copper that will not serve as the circuit pattern. That is, the copper that is not covered by the dry film may be removed. After the etching 16043, a peeling process may be added to complete the inner layer circuit pattern by removing the dry film remaining on the surface.

After the process of inner layer circuit forming 1604 is finished, the process of coverlay laminating 1605 may be done to bond the processed coverlay using a soldering iron.

The support member according to various embodiments of the present disclosure may be manufactured through the above processes. The support member may be further processed to couple to the pressure sensor construction and the display. Thus, the support member may further undergo outer layer laminating 1606.

The outer layer laminating 1606 may be a process of laminating another base layer to the support member manufactured through the above processes. In this case, since the manufactured support member is subjected to the outer shape processing 1602, it may be laminated after the outer layer to be laminated is also subjected to the base layer cutting and/or the outer shape processing. According to one embodiment, the base layer of the outer layer additionally laminated may be made of a material which is the same as or different from the existing base layer.

After the process of outer layer laminating 1606, drill processing 1607 may be achieved. The conductive via or the conductive contact may be manufactured through the drill processing 1607 according to various embodiments of the present disclosure.

After the drill processing 1607, copper plating 1608 may be achieved. In this case, conductivity may be provided by plating conductive copper into the holes generated by the drill processing 1607.

After the copper plating 1608, outer layer circuit forming 1609 may be achieved. The outer layer circuit forming 1609 may be a process which is the same as the aforementioned inner layer circuit forming 1604. A pressure sensor component (e.g., a first electrode layer) or a display component may be coupled to the outer layer according to various embodiments of the present disclosure at the same time of or after the outer layer circuit forming 1609. Thereafter, another outer layer may be laminated and the aforementioned procedure may be repeated to manufacture an electronic device of a multi-layer structure. Additionally, final processing may be achieved through the coverlay laminating 1610, surface plating, printing, or the like.

The process BBT 1611 checks for electrical or circuit malfunctions (e.g., open circuit, short circuit).

Finally, inspecting 1612 may be further included to inspect extra defects. Finally, at process packaging 1613, the product may be packaged in unit for delivery.

As described above, an electronic device according to various embodiments of the present disclosure may have a minimized bezel (or an IA area).

The electronic device according to various embodiments of the present disclosure may have a narrow width of not only left and right bezels but also upper and lower bezels. That is, various embodiments of the present disclosure may provide a substantially bezel-less electronic device.

While the present disclosure has been shown and described with reference to various embodiments thereof, it will be understood by those skilled in the art that various changes in form and details may be made therein without departing from the spirit and scope of the invention as defined by the appended claims. Therefore, the scope of the present disclosure is defined not by the detailed description of the present disclosure but by the appended claims, and all differences within the scope will be construed as being included in the present disclosure.

What is claimed is:

1. An electronic device comprising:
    a touch screen display;
    a Printed Circuit Board (PCB);
    a pressure sensor disposed between the touch screen display and the PCB, and having an active area for sensing pressure and an inactive area disposed around the active area; and
    an electrically conductive connection member including a first plurality of wirings for electrically directly connecting the pressure sensor and the PCB, and a second plurality of wirings for electrically directly connecting the touch screen display and the PCB,
    wherein the electrically conductive connection member is connected to a portion of the PCB corresponding to the active area of the pressure sensor, and
    wherein the electrically conductive connection member is directly connected to a portion of the PCB corresponding to an active area of the touch screen display.

2. The electronic device of claim 1, further comprising a housing including a first surface facing a first direction and a second surface facing a second direction opposite to the first direction, wherein a transparent cover forms at least one part of the first surface,
    wherein the transparent cover is substantially entirety of the first surface of the housing, and
    wherein the touch screen display is exposed through an area that is substantially entirety of the transparent cover.

3. The electronic device of claim 2, wherein the area in which the touch screen display is exposed through the transparent cover overlaps with the active area of the pressure sensor when the electronic device is viewed in the second direction, and
    wherein the electrically conductive connection member is not disposed on another portion of the PCB corresponding to the inactive area of the pressure sensor.

4. The electronic device of claim 1, wherein the pressure sensor comprises:
    a first electrode layer disposed in parallel with the touch screen display;
    a second electrode layer separated from the first electrode layer in a first direction and in parallel with the first electrode layer; and
    a plurality of wirings separated from the first electrode layer in a second direction opposite to the first direction, extending in parallel with the first electrode layer, and electrically connected to the first electrode layer and/or the second electrode layer,
    wherein the plurality of wirings are electrically connected to the electrically conductive connection member.

5. The electronic device of claim 4, wherein the first electrode layer, the second electrode layer, and the plurality of wirings are electrically coupled to a first Flexible Printed Circuit Board (FPCB).

6. The electronic device of claim 4,
    wherein the electronic device further includes at least one support member disposed between the pressure sensor and the PCB, and
    wherein the electrically conductive connection member includes a conductive via which penetrates the at least one support member.

7. The electronic device of claim 6,
    wherein the electrically conductive connection member further includes a conductive construction electrically connected to the conductive via, and
    wherein the conductive construction is disposed between the pressure sensor and the PCB.

8. The electronic device of claim 7, wherein the conductive construction is a C-clip, a Fogo-pin, or a bonding pad.

9. The electronic device of claim 6, wherein the electrically conductive connection member includes a first Flexible Printed Circuit Board (FPCB) where at least a portion of the plurality of wirings are disposed.

10. The electronic device of claim 9, wherein the at least one support member further includes an opening, and
    wherein the first FPCB is a protrusion extending from one side of the opening.

11. The electronic device of claim 4, further comprising a conductive via for electrically connecting the first electrode layer and/or the second electrode layer to the plurality of wirings by penetrating the first electrode layer and/or the second electrode layer in an inactive area of the pressure sensor.

12. An electronic device comprising:
    an input device including at least one sensor;
    a Printed Circuit Board (PCB);
    a display disposed between the input device and the PCB; and
    a support member disposed between the display and the PCB,
    wherein the input device is electrically connected to the PCB through a first plurality of wirings disposed on the support member, and the display is electrically connected to the PCB through a second plurality of wirings disposed on the support member, wherein the first plurality of wirings are connected to a first portion of the PCB corresponding to an active area of at least one of the input device and the display, and wherein the second plurality of wirings are connected to a second portion of the PCB corresponding to an active area of at least one of the input device and the display.

13. The electronic device of claim 12, further comprising a housing including a first surface facing a first direction and a second surface facing a second direction opposite to the first direction, wherein a transparent cover forms at least one part of the first surface, wherein the transparent cover is substantially entirety of the first surface of the housing, and wherein the active area of the input device and the active area of the display are exposed through an area that is substantially entirety of the transparent cover.

14. The electronic device of claim 13, wherein the input device includes a touch sensor for sensing a touch position of an external object and a pressure sensor for sensing pressure exerted by the external object on the transparent cover.

15. The electronic device of claim 12, further comprising:

a first conductive via which penetrates the input device and the display, and a second conductive via which penetrates the display, wherein the first conductive via electrically connects the first plurality of wirings of the support member to the input device, and the second conductive via electrically connects the second plurality of wirings of the support member to the display.

16. The electronic device of claim 12, wherein the first plurality of wirings and the second plurality of wirings are electrically connected to the PCB through an electrically conductive connection member that penetrates the support member.

17. The electronic device of claim 16, wherein the electrically conductive connection member includes a conductive via which penetrates the support member.

18. The electronic device of claim 17, wherein the electrically conductive connection member further includes a conductive construction electrically connected to the conductive via, and wherein the conductive construction is disposed between the support member and the PCB.

19. The electronic device of claim 18, wherein the conductive construction is a C-clip, a Fogo-pin, or a bonding pad.

20. The electronic device of claim 15, wherein:

the support member includes at least one opening, the electrically conductive connection member includes first and second Flexible Printed Circuit Boards (FPCBs) protruding from opposite sides of the at least one opening, and portions of the first plurality of wirings are disposed on the first FPCB and portions of the second plurality of wirings are disposed on the second FPCB.

* * * * *